United States Patent
Kinugasa et al.

(10) Patent No.: US 11,264,989 B1
(45) Date of Patent: Mar. 1, 2022

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Masanori Kinugasa, Yokohama Kanagawa (JP); Tooru Wakahoi, Kawasaki Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/191,953

(22) Filed: Mar. 4, 2021

(30) Foreign Application Priority Data

Aug. 7, 2020 (JP) .............................. JP2020-135053
Jan. 12, 2021 (JP) .............................. JP2021-002896

(51) Int. Cl.
  *H03K 19/003* (2006.01)
  *H03K 19/0185* (2006.01)
  *H03K 19/088* (2006.01)
  *H03K 19/00* (2006.01)

(52) U.S. Cl.
  CPC . *H03K 19/018507* (2013.01); *H03K 19/0016* (2013.01); *H03K 19/018592* (2013.01); *H03K 19/088* (2013.01)

(58) Field of Classification Search
  CPC ....... H03K 19/0016; H03K 19/018507; H03K 19/018592; H03K 19/088
  See application file for complete search history.

(56) References Cited

U.S. PATENT DOCUMENTS

| | | | | |
|---|---|---|---|---|
| 4,680,487 A | * | 7/1987 | Kobayashi | .......... G06F 13/4072 326/17 |
| 4,697,107 A | * | 9/1987 | Haines | ............. H03K 19/09429 326/58 |
| 5,250,775 A | | 10/1993 | Maehara et al. | |
| 5,614,842 A | | 3/1997 | Doke et al. | |
| 5,936,429 A | | 8/1999 | Tomita | |
| 6,094,067 A | * | 7/2000 | Taniguchi | ........ H03K 19/09429 326/58 |
| 6,107,832 A | * | 8/2000 | Taniguchi | .......... H03K 19/0013 326/58 |

(Continued)

FOREIGN PATENT DOCUMENTS

JP    H04-291410 A    10/1992
JP    H06-119086 A    4/1994

(Continued)

*Primary Examiner* — Kurtis R Bahr
(74) *Attorney, Agent, or Firm* — Allen & Overy LLP

(57) ABSTRACT

According to one embodiment, a semiconductor device includes first, second, third, and fourth circuits. A first voltage is applied to the first circuit. A second voltage is applied to each of the second, third and fourth circuits. The third circuit is configured to generate a first control signal and a second control signal based on a signal generated by the first circuit and a signal generated by the second circuit. The fourth circuit is configured to output an output signal based on the first control signal and the second control signal. The output signal is brought to a high impedance state when at least one of the first voltage or the second voltage is not applied.

18 Claims, 25 Drawing Sheets

(56) References Cited

U.S. PATENT DOCUMENTS

| | | | | |
|---|---|---|---|---|
| 6,154,058 | A * | 11/2000 | Sawai | H03K 19/00315 326/24 |
| 6,373,287 | B1 * | 4/2002 | Matsumoto | H03K 19/018585 326/83 |
| 6,388,467 | B1 * | 5/2002 | Ward | H03K 19/00315 326/56 |
| 6,744,298 | B2 | 6/2004 | Yamauchi et al. | |
| 7,456,663 | B2 * | 11/2008 | Lim | H03K 19/0016 327/112 |
| 2003/0137327 | A1 * | 7/2003 | Moon | H03K 19/00315 327/112 |
| 2003/0151954 | A1 * | 8/2003 | Nagatome | G11C 7/1057 365/189.05 |
| 2004/0010726 | A1 | 1/2004 | Motegi et al. | |
| 2004/0155679 | A1 | 8/2004 | Takiba et al. | |

FOREIGN PATENT DOCUMENTS

| | | |
|---|---|---|
| JP | H07-066710 A | 3/1995 |
| JP | H08-079047 A | 3/1996 |
| JP | H10-093414 A | 4/1998 |
| JP | 2002-290229 A | 10/2002 |
| JP | 2002-319853 A | 10/2002 |
| JP | 2004-048370 A | 2/2004 |
| JP | 2004-247846 A | 9/2004 |
| JP | 2004-362346 A | 12/2004 |
| JP | 2005-033637 A | 2/2005 |
| JP | 3889954 B2 | 3/2007 |
| JP | 2014-093678 A | 5/2014 |

* cited by examiner

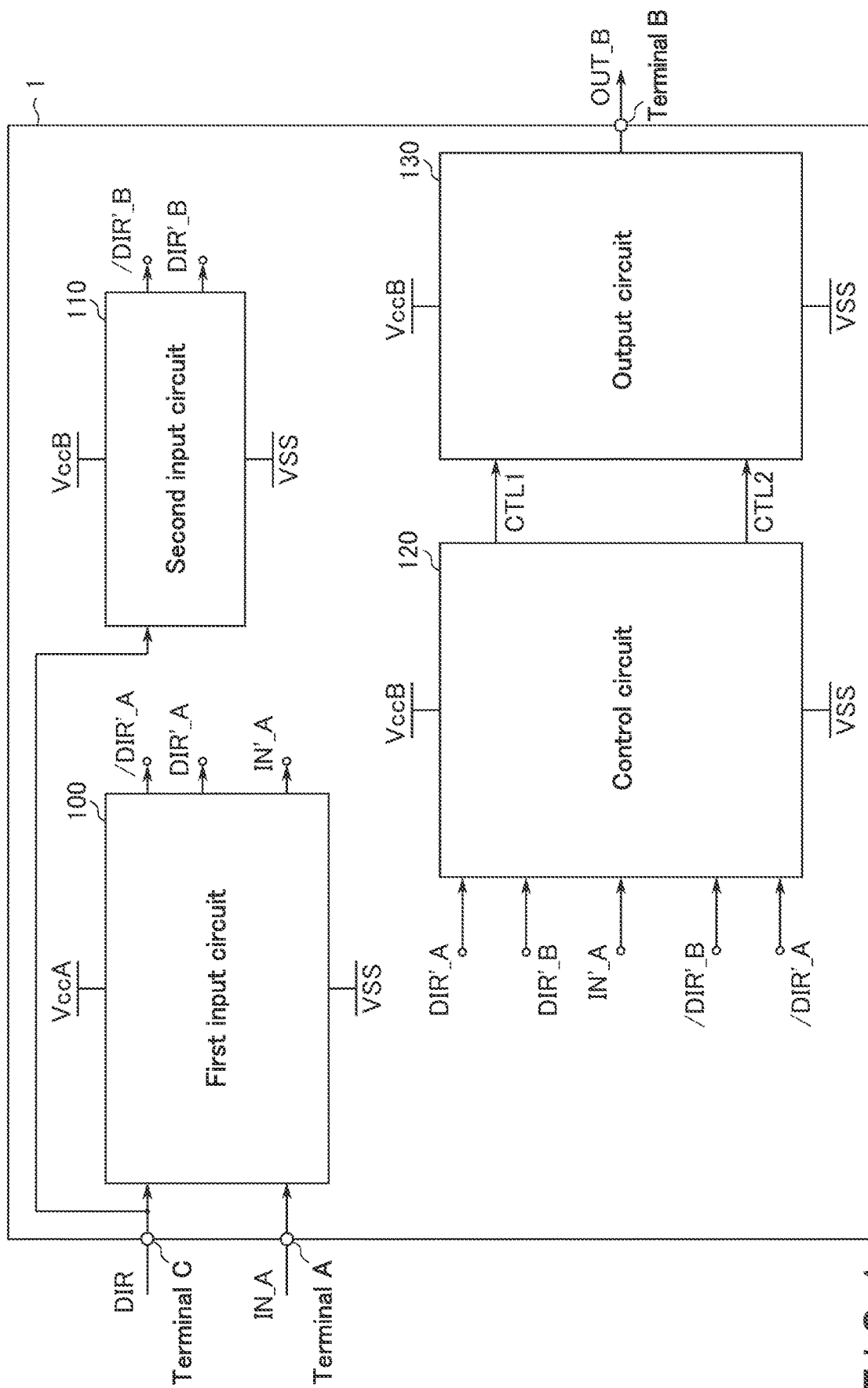
F I G. 1

| DIR | IN_A | DIR'_A | /DIR'_A | DIR'_B | /DIR'_B | IN'_A | N0 | N1 | N2 | OUT_B |
|---|---|---|---|---|---|---|---|---|---|---|
| H | H | H | L | H | L | H | L | L | L | H |
| H | L | H | L | H | L | L | L | H | H | L |
| L | H | L | H | L | H | H | L | H | L | HZ |
| L | L | L | H | L | H | L | L | H | L | HZ |

FIG. 6

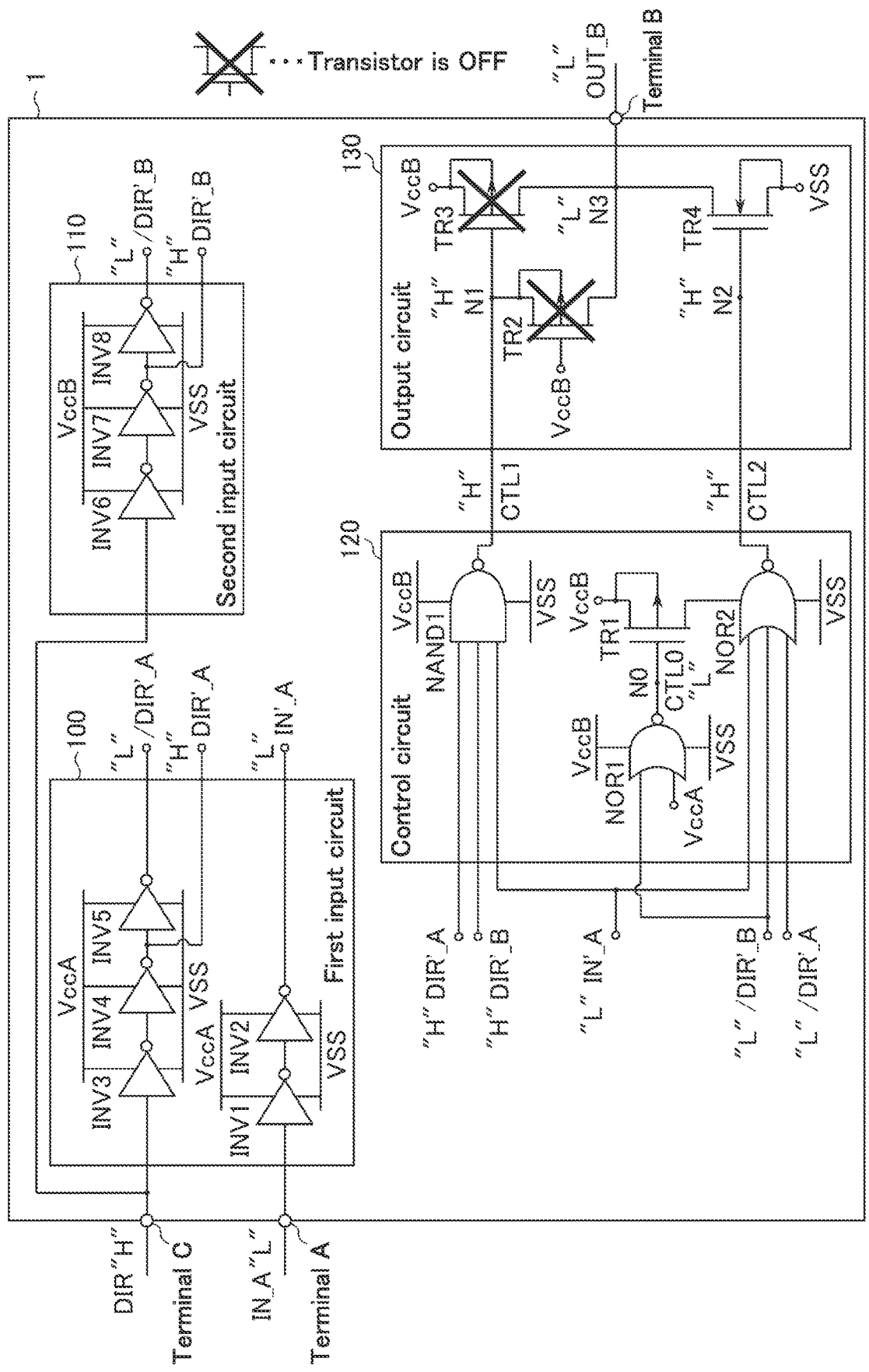
F I G. 8

| DIR | IN_A | DIR_A | /DIR_A | DIR_B | /DIR_B | IN'_A | N0 | N1 | N2 | OUT_B |
|---|---|---|---|---|---|---|---|---|---|---|
| H | H | H | L | L | L | H | L | L/H | L | HZ |
| H | L | H | L | L | L | L | L | L/H | L | HZ |
| L | H | L | H | L | L | H | L | L/H | L | HZ |
| L | L | L | H | L | L | L | L | L/H | L | HZ |

F I G. 11

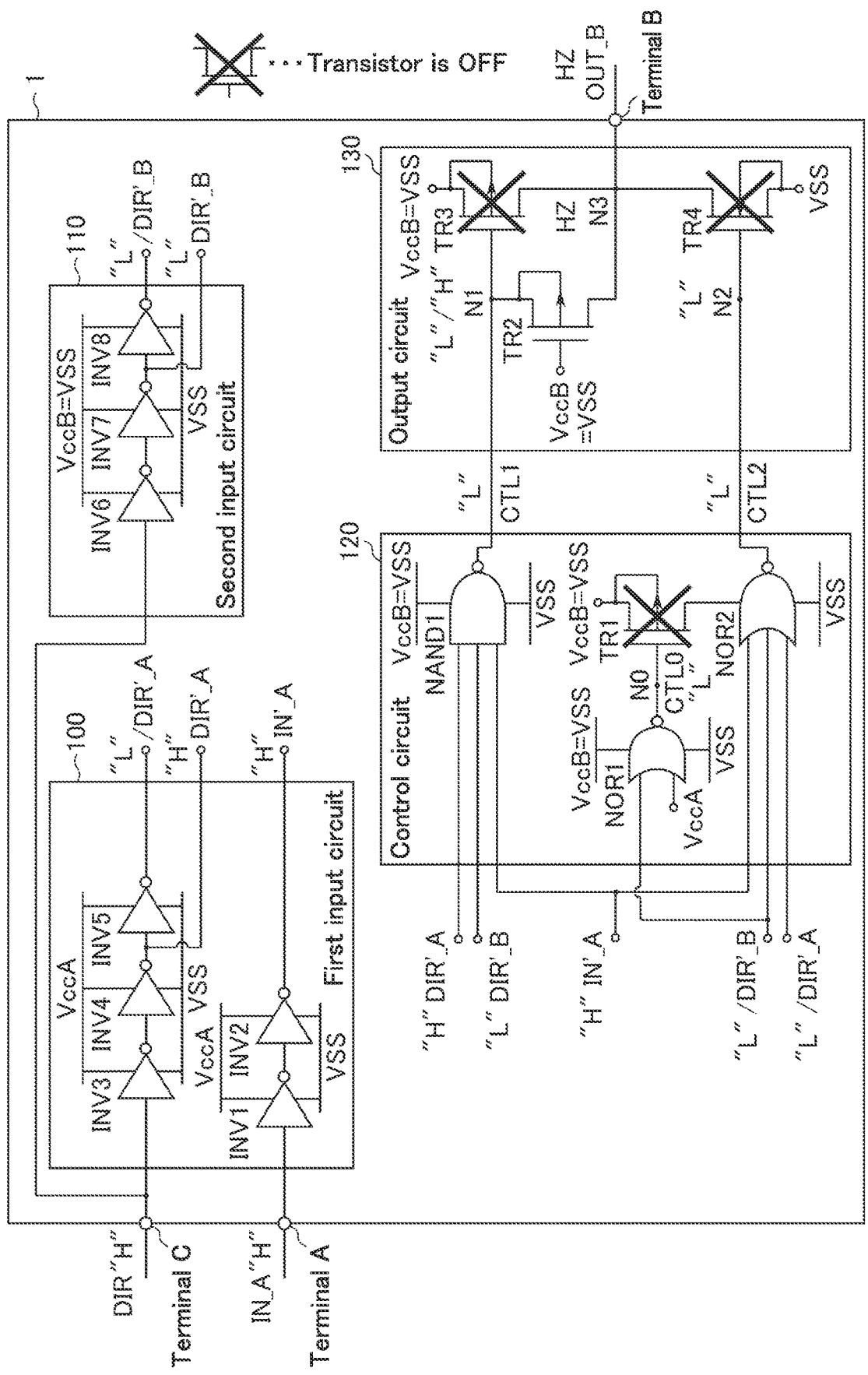
F I G. 12

| DIR | IN_A | DIR'_A | /DIR'_A | DIR'_B | /DIR'_B | IN'_A | N0 | N1 | N2 | OUT_B |
|---|---|---|---|---|---|---|---|---|---|---|
| H | H | L | L | H | L | L | H | H | L | HZ |
| H | L | L | L | H | L | L | H | H | L | HZ |
| L | H | L | L | L | H | L | L | H | L | HZ |
| L | L | L | L | L | H | L | L | H | L | HZ |

FIG. 16

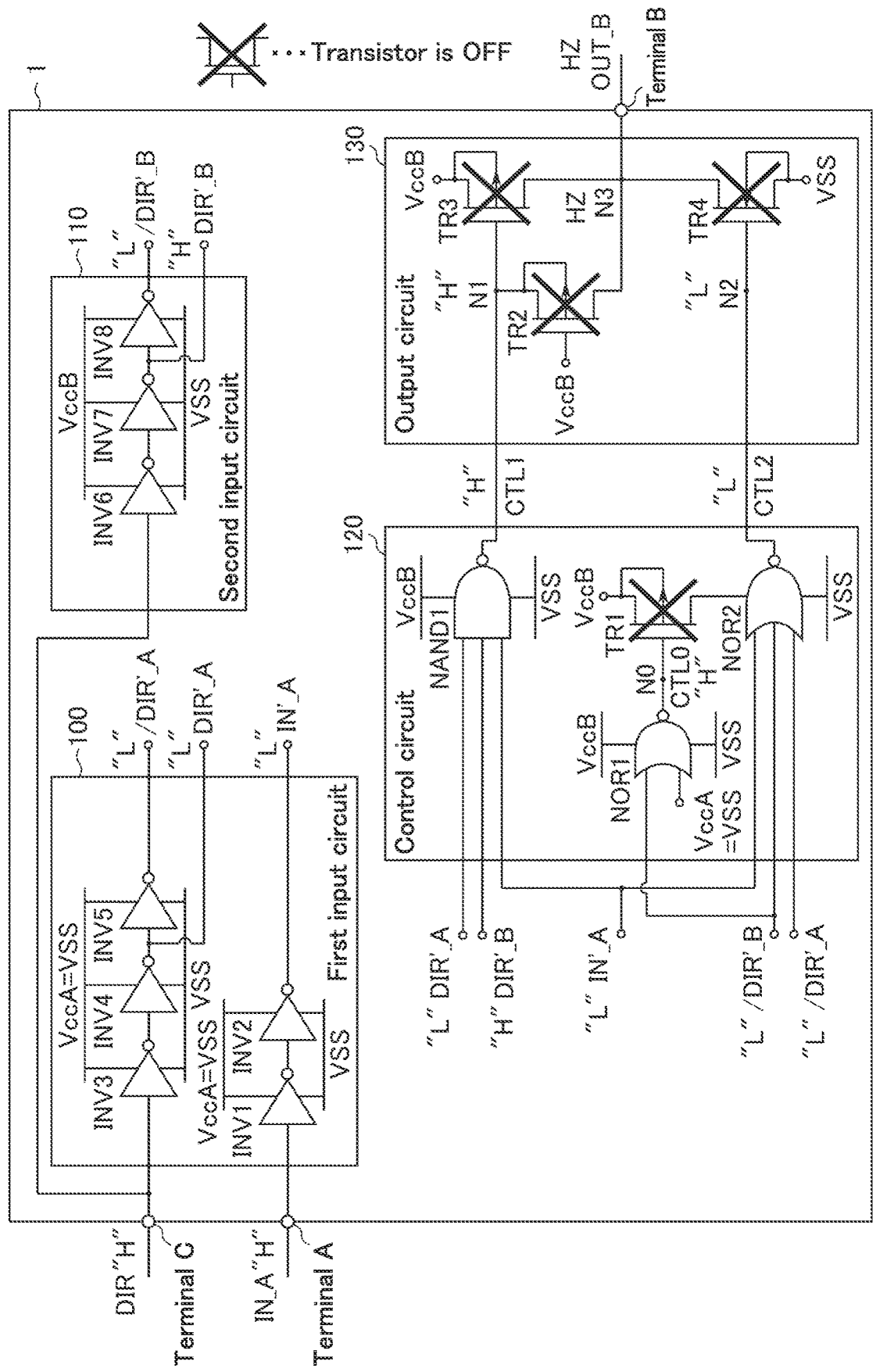
F I G. 17

| DIR | IN_A | OUT_A | DIR'_A | DIR_A/DIR'_A | DIR_B | DIR'_B/DIR'_B | IN'_A | IN'_B | N0 | N1 | N2 | N4 | N5 | N6 | OUT_B | IN_B |
|---|---|---|---|---|---|---|---|---|---|---|---|---|---|---|---|---|
| H | H | HZ | H | L | H | L | H | H | L | L | L | L | H | L | H | H |
| H | L | HZ | H | L | H | L | L | L | L | L | H | L | H | L | L | L |
| L | H | H | L | H | L | H | H | L | L | H | L | L | L | L | HZ | H |
| L | L | L | L | H | L | H | L | L | L | H | L | L | H | H | HZ | L |

| DIR | IN_A | OUT_A | DIR_A | /DIR_A | DIR_B | /DIR_B | IN'_A | IN'_B | N0 | N1 | N2 | N4 | N5 | N6 | OUT_B | IN_B |
|---|---|---|---|---|---|---|---|---|---|---|---|---|---|---|---|---|
| H | H | HZ | H | L | L | L | H | L | L | L/H | L | L | H | L | HZ | HZ |
| H | L | HZ | H | L | L | L | L | L | L | L/H | L | L | H | L | HZ | HZ |
| L | HZ | HZ | L | H | L | L | HZ | L | L | L/H | L | H | H | L | HZ | H |
| L | HZ | HZ | L | H | L | L | HZ | L | L | L/H | L | H | H | L | HZ | L |

| DIR | IN_A | OUT_A | DIR'_A | /DIR'_A | DIR'_B | /DIR'_B | IN'_A | IN'_B | N0 | N1 | N2 | N4 | N5 | N6 | OUT_B | IN_B |
|---|---|---|---|---|---|---|---|---|---|---|---|---|---|---|---|---|
| H | H | HZ | L | L | H | L | L | HZ | H | H | L | L | L/H | L | HZ | HZ |
| H | L | HZ | L | L | H | L | L | HZ | H | H | L | L | L/H | L | HZ | HZ |
| L | HZ | HZ | L | L | L | H | L | H | L | H | L | L | L/H | L | HZ | H |
| L | HZ | HZ | L | L | L | H | L | L | L | H | L | L | L/H | L | HZ | L |

F I G. 24

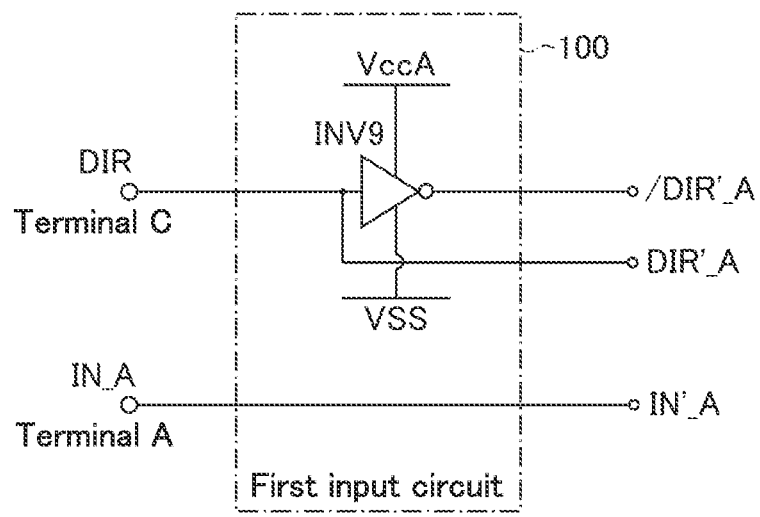
F I G. 25
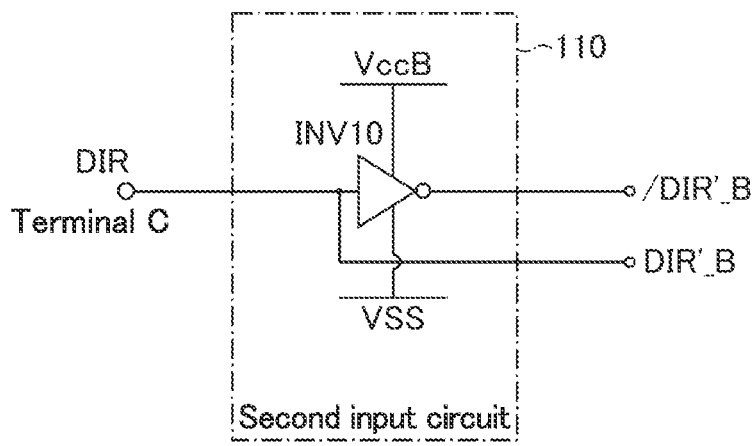
F I G. 26

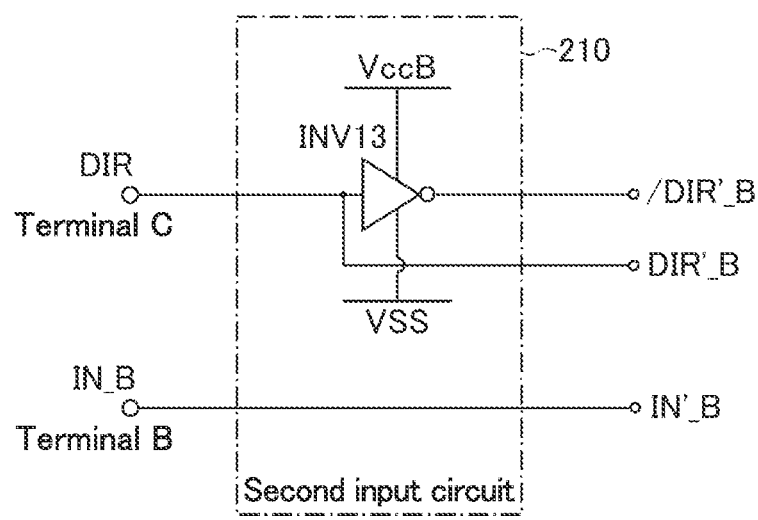
F I G. 27

SEMICONDUCTOR DEVICE

CROSS-REFERENCE TO RELATED APPLICATIONS

This application is based upon and claims the benefit of priority from Japanese Patent Application No. 2020-135053, filed Aug. 7, 2020; and No. 2021-002896, filed Jan. 12, 2021, the entire contents of all of which are incorporated herein by reference.

FIELD

Embodiments described herein relate generally to a semiconductor device.

BACKGROUND

A semiconductor device including two power supplies is known.

BRIEF DESCRIPTION OF THE DRAWINGS

FIG. 1 is a block diagram of a semiconductor integrated circuit according to a first embodiment.

FIG. 6 is a truth table of the semiconductor integrated circuit according to the first embodiment in operation.

FIG. 8 illustrates an operation of the semiconductor integrated circuit according to the first embodiment.

FIG. 11 is a truth table of the semiconductor integrated circuit according to the first embodiment in operation.

FIG. 12 illustrates an operation of the semiconductor integrated circuit according to the first embodiment.

FIG. 16 is a truth table of the semiconductor integrated circuit according to the first embodiment in operation.

FIG. 17 illustrates an operation of the semiconductor integrated circuit according to the first embodiment.

FIG. 22 is a truth table of the semiconductor integrated circuit according to the second embodiment in operation.

FIG. 23 is a truth table of the semiconductor integrated circuit according to the second embodiment in operation.

FIG. 24 is a truth table of the semiconductor integrated circuit according to the second embodiment in operation.

FIG. 25 is a circuit diagram of a modification of the first input circuit included in the semiconductor integrated circuit according to the first embodiment.

FIG. 26 is a circuit diagram of a modification of the second input circuit included in the semiconductor integrated circuit according to the first embodiment.

FIG. 27 is a circuit diagram of a modification of the second input circuit included in the semiconductor integrated circuit according to the second embodiment.

DETAILED DESCRIPTION

Figure 2:
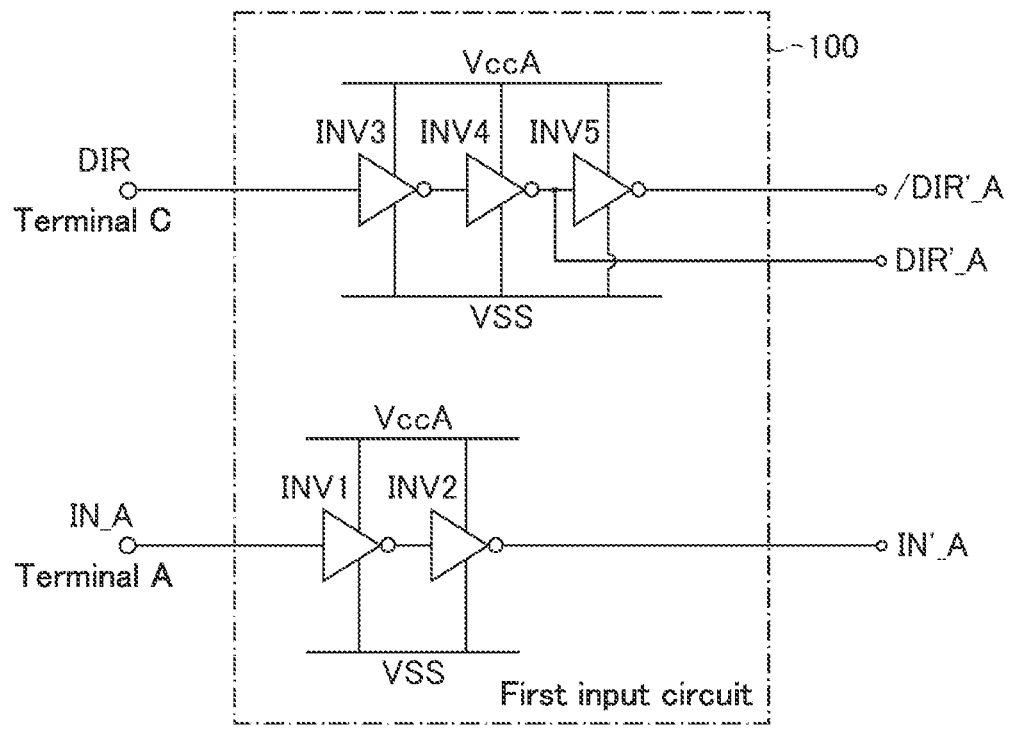
FIG. 2 is a circuit diagram of a first input circuit included in the semiconductor integrated circuit according to the first embodiment.

In general, according to one embodiment, a semiconductor device includes: a first circuit to which a first voltage is applied and which is capable of receiving a first input signal and a second input signal and is capable of generating a first signal based on the first input signal, a second signal based on the second input signal, and a third signal obtained by inverting a logic level of the second signal; a second circuit to which a second voltage different from the first voltage is applied and which is capable of receiving the second input signal and is capable of generating a fourth signal based on the second input signal and a fifth signal obtained by inverting a logic level of the fourth signal; a third circuit to which the second voltage is applied and which is capable of generating a first control signal based on the first signal, the second signal, and the fourth signal, and a second control signal based on the first voltage, the first signal, the third signal, and the fifth signal; and a fourth circuit to which the second voltage is applied and which is capable of outputting an output signal based on the first control signal and the second control signal. The output signal is brought to a high impedance state when at least one of the first voltage or the second voltage is not applied.

Hereinafter, embodiments will be described with reference to the accompanying drawings. In the description below, constituent elements having the same function and configuration will be assigned a common reference symbol.

1 First Embodiment

A semiconductor device according to a first embodiment will be described. Hereinafter, a semiconductor integrated circuit (hereinafter referred to as an "integrated circuit (IC)" including two power supplies will be described as an example of the semiconductor device.

1.1 Configuration

1.1.1 Overall Configuration of IC

First, a rough overall configuration of the IC according to the present embodiment will be described with reference to FIG. 1.

FIG. 1 is a circuit diagram showing an example of the IC 1 according to the present embodiment. The IC 1 has three supply terminals (not shown; an input terminal of a voltage VccA (VccA terminal), an input terminal of a voltage VccB (VccB terminal), and an input terminal of a ground voltage VSS (VSS terminal)). The voltage VccA is applied to the IC 1 via the VccA terminal, the voltage VccB is applied to the IC 1 via the VccB terminal, and the ground voltage VSS is applied to the IC 1 via the VSS terminal. The range of use of the voltage VccA is, for example, between 1.6 V and 3.6 V, and the range of use of the voltage VccB is, for example, between 2.5 V and 5.5 V. For example, the voltage VccA may be 3 V, and the voltage VccB may be 5 V.

The IC 1 also has three terminals (terminal A, terminal B, and terminal C) for input and output of signals. The signal input to the IC 1 is transmitted from the terminal A to the terminal B or from the terminal B to the terminal A in accordance with a signal input to the terminal C. In the present embodiment, the case where the signal is transmitted from the terminal A to the terminal B will be described.

An input signal IN_A is input to the IC 1 from an external device (not shown) via the terminal A, and an output signal OUT_B is output from the IC 1 to the external device via the terminal B. A transmission switching input signal DIR is also input to the IC 1 from the external device via the terminal C. The transmission switching input signal DIR is a signal for switching the signal transmission direction between the terminal A and the terminal B. For example, when the logic level of the signal DIR is a high level ("H" level), a signal is transmitted from the terminal A to the terminal B. In contrast, when the logic level of the signal DIR is a low level ("L" level), a signal is transmitted from the terminal B to the terminal A.

The IC 1 may be incorporated into, for example, a system-on-a-chip (SOC). In this case, for example, the terminal A is coupled to a memory in the SOC via a bus (not shown), and the terminal B is coupled to a CPU in the SOC via a bus (not shown).

The IC 1 includes a first input circuit 100, a second input circuit 110, a control circuit 120, and an output circuit 130.

The first input circuit 100 operates using the voltage VccA as the operating voltage. The first input circuit 100 receives the signals IN_A and DIR from the external device. The first input circuit 100 generates a signal IN'_A based on the received signal IN_A, and transmits the generated signal IN'_A to the control circuit 120. The first input circuit 100 also generates a signal DIR'_A and a signal /DIR'_A (signal obtained by inverting the logic level of the signal DIR'_A) based on the received signal DIR, and transmits the generated signals DIR'_A and /DIR'_A to the control circuit 120. Details of the first input circuit 100 will be described later.

The second input circuit 110 operates using the voltage VccB as the operating voltage. The second input circuit 110 receives the signal DIR from the external device. The second input circuit 110 generates a signal DIR'_B and a signal /DIR'_B (signal obtained by inverting the logic level of the signal DIR'_B) based on the received signal DIR, and transmits the generated signals DIR'_B and /DIR'_B to the control circuit 120. Details of the second input circuit 110 will be described later.

The control circuit 120 operates using the voltage VccB as the operating voltage. The control circuit 120 controls the operation of the output circuit 130. Specifically, the control circuit 120 generates control signals CTL1 and CTL2 based on the signals IN'_A, DIR'_A, /DIR'_A, DIR'_B, and /DIR'_B received from the first input circuit 100, and transmits the generated signals CTL1 and CTL2 to the output circuit 130. The control signals CTL1 and CTL2 are signals for controlling the output circuit 130. Details of the control circuit 120 will be described later.

The output circuit 130 operates using the voltage VccB as the operating voltage. The output circuit 130 outputs the signal OUT_B to the external device based on the signals CTL1 and CTL2 received from the control circuit 120. Details of the output circuit 130 will be described later.

1.1.2 Configuration of First Input Circuit 100

Details of the configuration of the first input circuit 100 included in the IC 1 according to the present embodiment will be described with reference to FIG. 2. FIG. 2 is a circuit diagram showing an example of the configuration of the first input circuit 100 included in the IC 1 according to the present embodiment.

The first input circuit 100 includes inverter circuits INV1 to INV5. The inverter circuits INV1 to INV5 each operate using the voltage VccA as the operating voltage.

The inverter circuit INV1 receives the signal IN_A from the external device via the terminal A. The inverter circuit INV1 transmits a signal obtained by inverting the logic level of the received signal to the inverter circuit INV2.

The inverter circuit INV2 receives the signal from the inverter circuit INV1. The inverter circuit INV2 transmits a signal obtained by inverting the logic level of the received signal to the control circuit 120 as the signal IN'_A.

The inverter circuit INV3 receives the signal DIR from the external device via the terminal C. The inverter circuit INV3 transmits a signal obtained by inverting the logic level of the received signal to the inverter circuit INV4.

The inverter circuit INV4 receives the signal from the inverter circuit INV3. The inverter circuit INV4 transmits a signal obtained by inverting the logic level of the received signal to the inverter circuit INV5 and the control circuit 120 as the signal DIR'_A.

The inverter circuit INV5 receives the signal DIR'_A from the inverter circuit INV4. The inverter circuit INV5 transmits a signal obtained by inverting the logic level of the received signal to the control circuit 120 as the signal /DIR'_A.

The number of inverter circuits INV included in the first input circuit 100 is not limited to five. In the first input circuit 100, the number of inverter circuits INV coupled to the terminal A may be any even number, and the number of inverter circuits INV coupled to the terminal C may be any odd number.

1.1.3 Configuration of Second Input Circuit 110

Figure 3:
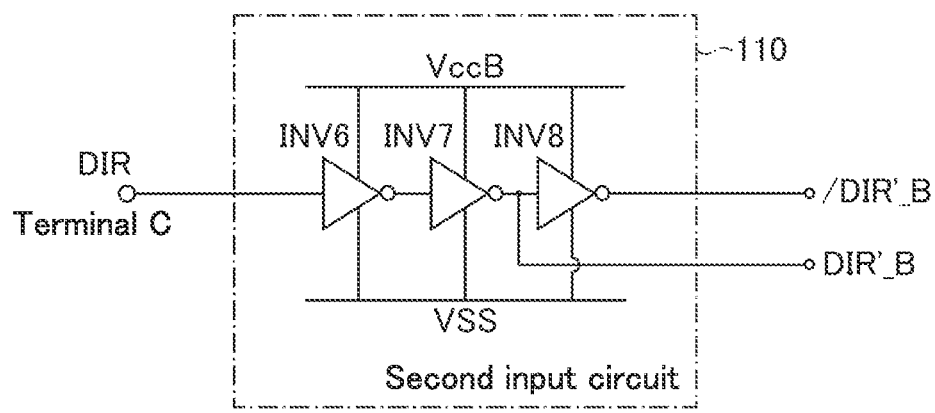
FIG. 3 is a circuit diagram of a second input circuit included in the semiconductor integrated circuit according to the first embodiment.

Details of the configuration of the second input circuit 110 included in the IC 1 according to the present embodiment will be described with reference to FIG. 3. FIG. 3 is a circuit diagram showing an example of the configuration of the second input circuit 110 included in the IC 1 according to the present embodiment.

The second input circuit 110 includes inverter circuits INV6 to INV8. The inverter circuits INV6 to INV8 each operate using the voltage VccB as the operating voltage.

The inverter circuit INV6 receives the signal DIR from the external device via the terminal C. The inverter circuit INV6 transmits a signal obtained by inverting the logic level of the received signal to the inverter circuit INV7.

The inverter circuit INV7 receives the signal from the inverter circuit INV6. The inverter circuit INV7 transmits a signal obtained by inverting the logic level of the received signal to the inverter circuit INV8 and the control circuit 120 as the signal DIR'_B.

The inverter circuit INV8 receives the signal DIR'_B from the inverter circuit INV7. The inverter circuit INV8 transmits a signal obtained by inverting the logic level of the received signal to the control circuit 120 as the signal /DIR'_B.

The number of inverter circuits INV included in the second input circuit 110 is not limited to three. In the second input circuit 110, the number of inverter circuits INV coupled to the terminal C may be any odd number.

1.1.4 Configuration of Control Circuit 120

Figure 4:
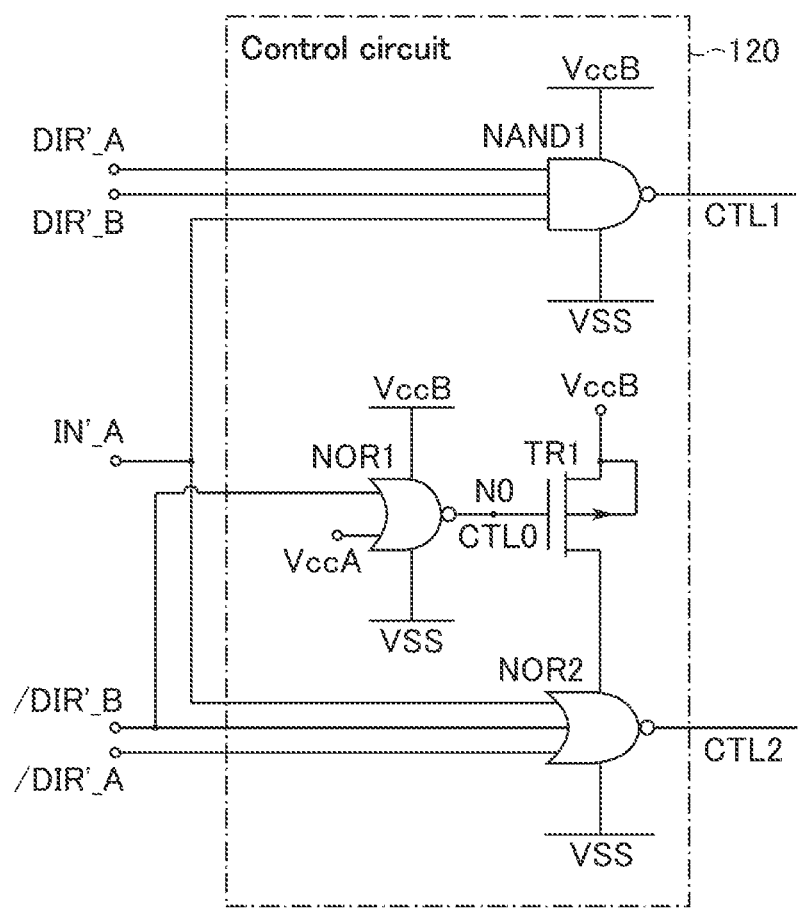
FIG. 4 is a circuit diagram of a control circuit included in the semiconductor integrated circuit according to the first embodiment.

Details of the configuration of the control circuit 120 included in the IC 1 according to the present embodiment will be described with reference to FIG. 4. FIG. 4 is a circuit diagram showing an example of the configuration of the control circuit 120 included in the IC 1 according to the present embodiment.

The control circuit 120 includes a NAND circuit NAND1, NOR circuits NOR1 and NOR2, and a p-channel MOS transistor TR1. In the following description, when the source and drain of a transistor are not distinguished from each other, one of the source and drain of the transistor will be referred to as "one end of the transistor", and the other one of the source and drain of the transistor will be referred to as "the other end of the transistor".

The NAND circuit NAND1 operates using the voltage VccB as the operating voltage. The NAND circuit NAND1 has three input terminals. The signal DIR'_A is input to the first input terminal of the NAND circuit NAND1, the signal DIR'_B is input to the second input terminal thereof, and the signal IN'_A is input to the third input terminal thereof. The NAND circuit NAND1 performs a NAND operation based on the signals DIR'_A, DIR'_B, and IN'_A. The NAND circuit NAND1 transmits a result of the operation to the output circuit 130 as the signal CTL1.

The NOR circuit NOR1 operates using the voltage VccB as the operating voltage. The NOR circuit NOR1 has two input terminals. The signal/DIR'_B is input to one input terminal of the NOR circuit NOR1, and the voltage VccA is applied to the other input terminal thereof. The NOR circuit NOR1 performs a NOR operation based on the signal/DIR'_B and the voltage VccA. The NOR circuit NOR1 transmits a result of the operation to a node NO as a signal CTL0.

The gate of the transistor TR1 is coupled to the node NO. The voltage VccB is applied to one end of the transistor TR1. The other end of the transistor TR1 is coupled to a supply terminal of the NOR circuit NOR2, and the voltage VccB is applied to the NOR circuit NOR2 when the transistor TR1 is ON.

The NOR circuit NOR2 operates using the voltage VccB as the operating voltage. The NOR circuit NOR2 has three input terminals. The signal/DIR'_A is input to the first input terminal of the NOR circuit NOR2, the signal/DIR'_B is input to the second input terminal thereof, and the signal IN'_A is input to the third input terminal thereof. The NOR circuit NOR2 performs a NOR operation based on the signals/DIR'_A, /DIR'_B, and IN'_A. The NOR circuit NOR2 transmits a result of the operation to the output circuit 130 as the signal CTL2.

1.1.5 Configuration of Output Circuit 130

Figure 5:
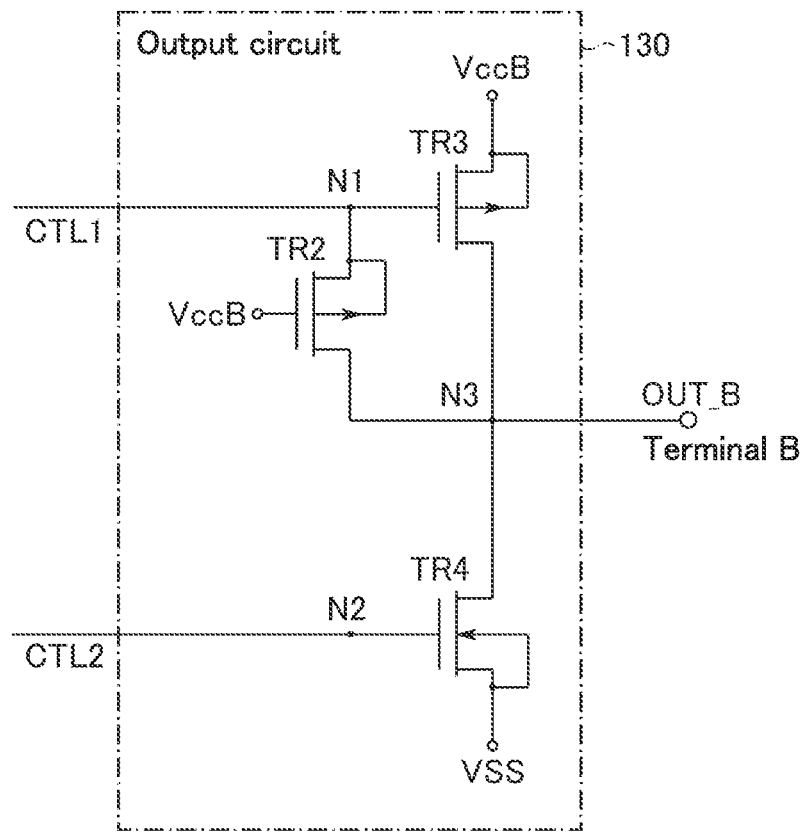
FIG. 5 is a circuit diagram of an output circuit included in the semiconductor integrated circuit according to the first embodiment.

Details of the configuration of the output circuit 130 included in the IC 1 according to the present embodiment will be described with reference to FIG. 5. FIG. 5 is a circuit diagram showing an example of the configuration of the output circuit 130 included in the IC 1 according to the present embodiment.

The output circuit 130 includes p-channel MOS transistors TR2 and TR3 and an n-channel MOS transistor TR4.

The voltage VccB is applied to the gate of the transistor TR2. One end of the transistor TR2 is coupled to a node N1. The signal CTL1 is input to the node N1 from the control circuit 120. The other end of the transistor TR2 is coupled to a node N3.

The gate of the transistor TR3 is coupled to the node N1. The voltage VccB is applied to one end of the transistor TR3. The other end of the transistor TR3 is coupled to the node N3.

The gate of the transistor TR4 is coupled to the node N2. The signal CTL2 is input to the node N2 from the control circuit 120. One end of the transistor TR4 is coupled to the node N3. A ground voltage VSS is applied to the other end of the transistor TR4.

The output circuit 130 outputs the signal OUT_B to the external device via the terminal B.

1.2 Operation

Next, the operation of the IC 1 according to the present embodiment will be described with reference to FIGS. 6 to 20. Herein, regarding the states of the supply voltages (voltages VccA and VccB), the supply voltage will be described as being at the "H" level when it is in the state of being applied to the IC 1, whereas the supply voltage will be described as being at the "L" level when it is in the state of not being applied to the IC 1, i.e., when it is in the state of being dropped to the GND level. For example, in the case where the IC 1 is used by being plugged into a PC, the voltage VccA is in the state of not being applied when the VccA terminal of the IC1 is not plugged into the VccA terminal of the PC, and the voltage VccB is in the state of not being applied when the VccB terminal of the IC 1 is not plugged into the VccB terminal of the PC. Also, when the PC is in the sleep mode, the supply voltage is in the state of not being applied.

The case where the voltages VccA and VccB are both at the "H" level will be described for each combination of the logic levels of the signal DIR and the logic levels of the signal IN_A. The truth table of this case is shown in FIG. 6.

Figure 7:
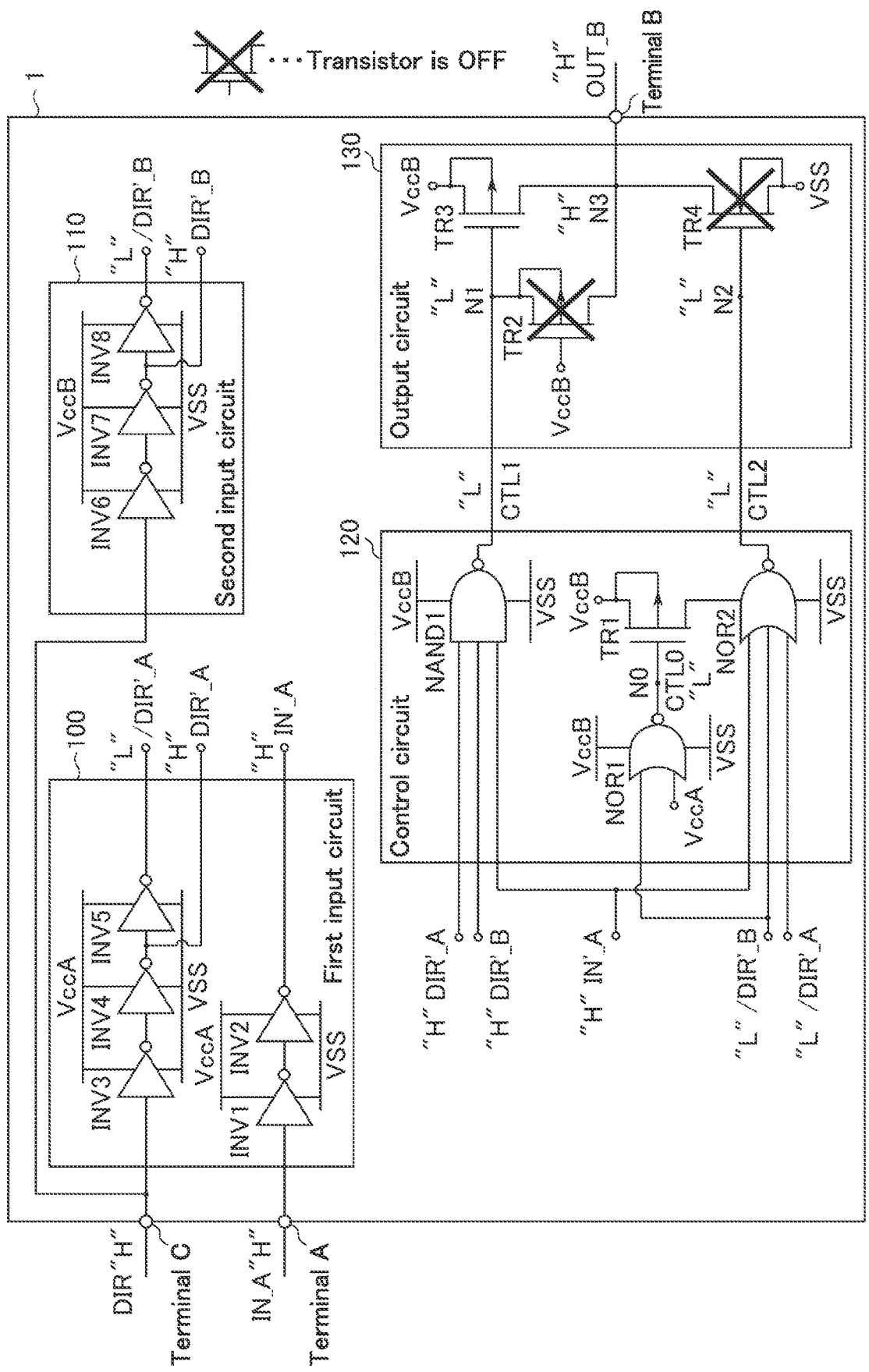
FIG. 7 illustrates an operation of the semiconductor integrated circuit according to the first embodiment.

FIG. 7 illustrates the operation of the IC 1 in the case where the voltages VccA and VccB are both at the "H" level, the signal DIR is at the "H" level, and the signal IN_A is at the "H" level. The logic levels of the signals DIR'_A, /DIR'_A, DIR'_B, /DIR'_B, and IN'_A, the voltage levels of the nodes NO to N2, and the state of the output signal OUT_B in this case are shown in the first row of the truth table in FIG. 6.

As shown in FIG. 7, the inverter circuit INV1 receives the signal IN_A ("H" level) from the external device. Since the voltage VccA ("H" level) is applied to the inverter circuits INV1 and INV2, the inverter circuit INV1 transmits an "L"-level signal to the inverter circuit INV2, and the inverter circuit INV2 transmits an "H"-level signal to the control circuit 120 as the signal IN'_A.

The inverter circuit INV3 receives the signal DIR ("H" level) from the external device. Since the voltage VccA ("H" level) is applied to the inverter circuits INV3 to INV5, the inverter circuit INV3 transmits an "L"-level signal to the inverter circuit INV4, the inverter circuit INV4 transmits an "H"-level signal to the inverter circuit INV5 and the control circuit 120 as the signal DIR'_A, and the inverter circuit INV5 transmits an "L"-level signal to the control circuit 120 as the signal/DIR'_A.

The inverter circuit INV6 receives the signal DIR ("H" level) from the external device. Since the voltage VccB ("H" level) is applied to the inverter circuits INV6 to INV8, the inverter circuit INV6 transmits an "L"-level signal to the inverter circuit INV7, the inverter circuit INV7 transmits an "H"-level signal to the inverter circuit INV8 and the control circuit 120 as the signal DIR'_B, and the inverter circuit INV8 transmits an "L"-level signal to the control circuit 120 as the signal/DIR'_B.

The signal DIR'_A ("H" level) is input to the first input terminal of the NAND circuit NAND1, the signal DIR'_B ("H" level) is input to the second input terminal thereof, and the signal IN'_A ("H" level) is input to the third input terminal thereof. Since the voltage VccB ("H" level) is applied to the NAND circuit NAND1, the NAND circuit NAND1 performs a NAND operation, and transmits a result of the operation ("L" level) to the output circuit 130 as the signal CTL1.

The signal/DIR'_B ("L" level) is input to one input terminal of the NOR circuit NOR1, and the voltage VccA ("H" level) is applied to the other input terminal thereof. Since the voltage VccB ("H" level) is applied to the NOR circuit NOR1, the NOR circuit NOR1 performs a NOR operation, and transmits a result of the operation ("L" level) to the node N0 as the signal CTL0.

The signal CTL0 ("L" level) is input to the node N0 from the NOR circuit NOR1, and the voltage of the node N0 is brought to the "L" level. Since the voltage ("L" level) of the node N0 is applied to the gate of the transistor TR1 and the voltage VccB is applied to one end of the transistor TR1, the transistor TR1 is turned on.

The signal/DIR'_A ("L" level) is input to the first input terminal of the NOR circuit NOR2, the signal/DIR'_B ("L" level) is input to the second input terminal thereof, and the signal IN'_A ("H" level) is input to the third input terminal thereof. Since the voltage VccB ("H" level) is applied to the NOR circuit NOR2 via the transistor TR1, the NOR circuit NOR2 performs a NOR operation, and transmits a result of the operation ("L" level) to the output circuit 130 as the signal CTL2.

Since the voltage VccB ("H" level) is applied to the gate of the transistor TR2, the transistor TR2 is turned off.

The signal CTL1 ("L" level) is input to the node N1 from the NAND circuit NAND1, and the voltage of the node N1 is brought to the "L" level. Since the voltage ("L" level) of the node N1 is applied to the gate of the transistor TR3 and the voltage VccB is applied to one end of the transistor TR3, the transistor TR3 is turned on. The signal CTL2 ("L" level) is input to the node N2 from the NOR circuit NOR2, and the voltage of the node N2 is brought to the "L" level. Since the voltage ("L" level) of the node N2 is applied to the gate of the transistor TR4, the transistor TR4 is turned off. The transistors TR2 and TR4 are turned off, whereas the transistor TR3 is turned on. As a result, the voltage of the node N3 is brought to the "H" level, and the output circuit 130 brings the signal OUT_B to the "H" level.

FIG. 8 illustrates the operation of the IC 1 in the case where the voltages VccA and VccB are both at the "H" level, the signal DIR is at the "H" level, and the signal IN_A is at the "L" level. The logic levels of the signals DIR'_A, /DIR'_A, DIR'_B, /DIR'_B, and IN'_A, the voltage levels of the nodes N0 to N2, and the state of the output signal OUT_B in this case are shown in the second row of the truth table in FIG. 6.

As shown in FIG. 8, the inverter circuit INV1 receives the signal IN_A ("L" level) from the external device. The inverter circuit INV1 transmits an "H"-level signal to the inverter circuit INV2, and the inverter circuit INV2 transmits an "L"-level signal to the control circuit 120 as the signal IN'_A.

Details of the operations of the inverter circuits INV3 to INV8 are the same as those in the case of FIG. 7.

The signal DIR'_A ("H" level) is input to the first input terminal of the NAND circuit NAND1, the signal DIR'_B ("H" level) is input to the second input terminal thereof, and the signal IN'_A ("L" level) is input to the third input terminal thereof. The NAND circuit NAND1 performs a NAND operation, and transmits a result of the operation ("H" level) to the output circuit 130 as the signal CTL1.

Details of the voltage of the node N0 and the operations of the NOR circuit NOR1 and the transistor TR1 are the same as those in the case of FIG. 7.

The signal/DIR'_A ("L" level) is input to the first input terminal of the NOR circuit NOR2, the signal/DIR'_B ("L" level) is input to the second input terminal thereof, and the signal IN'_A ("L" level) is input to the third input terminal thereof. The NOR circuit NOR2 performs a NOR operation, and transmits a result of the operation ("H" level) to the output circuit 130 as the signal CTL2.

Details of the operation of the transistor TR2 are the same as those in the case of FIG. 7.

The signal CTL1 ("H" level) is input to the node N1 from the NAND circuit NAND1, and the voltage of the node N1 is brought to the "H" level. Since the voltage ("H" level) of the node N1 is applied to the gate of the transistor TR3, the transistor TR3 is turned off. The signal CTL2 ("H" level) is input to the node N2 from the NOR circuit NOR2, and the voltage of the node N2 is brought to the "H" level. Since the voltage ("H" level) of the node N2 is applied to the gate of the transistor TR4 and the ground voltage VSS is applied to the other end of the transistor TR4, the transistor TR4 is turned on. The transistors TR2 and TR3 are turned off, whereas the transistor TR4 is turned on. As a result, the voltage of the node N3 is brought to the "L" level, and the output circuit 130 brings the signal OUT_B to the "L" level.

Figure 9:
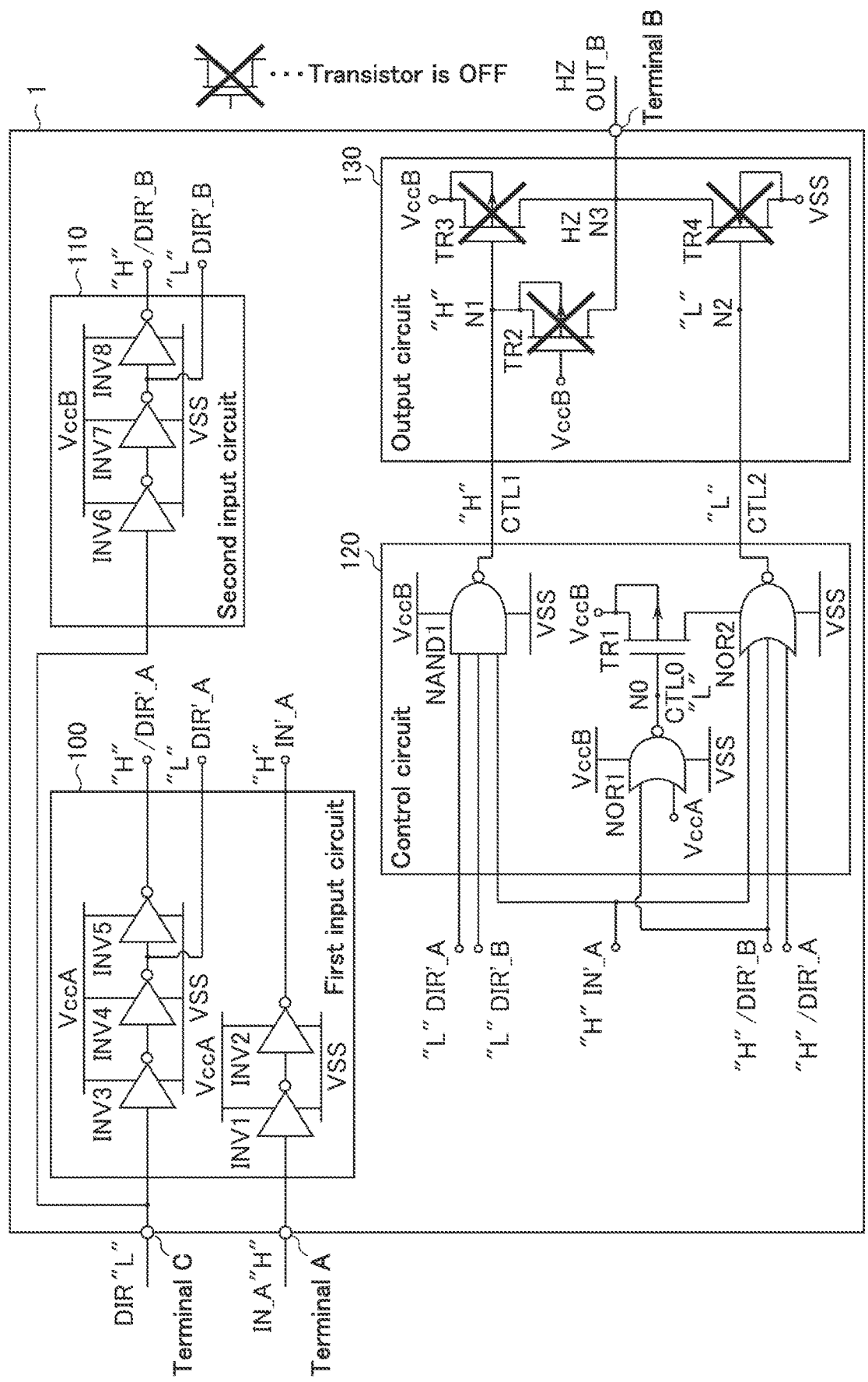
FIG. 9 illustrates an operation of the semiconductor integrated circuit according to the first embodiment.

FIG. 9 illustrates the operation of the IC 1 in the case where the voltages VccA and VccB are both at the "H" level, the signal DIR is at the "L" level, and the signal IN_A is at the "H" level. The logic levels of the signals DIR'_A, /DIR'_A, DIR'_B, /DIR'_B, and IN'_A, the voltage levels of the nodes N0 to N2, and the state of the output signal OUT_B in this case are shown in the third row of the truth table in FIG. 6.

As shown in FIG. 9, details of the operations of the inverter circuits INV1 and INV2 are the same as those in the case of FIG. 7.

The inverter circuit INV3 receives the signal DIR ("L" level) from the external device. The inverter circuit INV3 transmits an "H"-level signal to the inverter circuit INV4, the inverter circuit INV4 transmits an "L"-level signal to the inverter circuit INV5 and the control circuit 120 as the signal DIR'_A, and the inverter circuit INV5 transmits an "H"-level signal to the control circuit 120 as the signal /DIR'_A.

The inverter circuit INV6 receives the signal DIR ("L" level) from the external device. The inverter circuit INV6 transmits an "H"-level signal to the inverter circuit INV7, the inverter circuit INV7 transmits an "L"-level signal to the inverter circuit INV8 and the control circuit 120 as the signal DIR'_B, and the inverter circuit INV8 transmits an "H"-level signal to the control circuit 120 as the signal /DIR'_B.

The signal DIR'_A ("L" level) is input to the first input terminal of the NAND circuit NAND1, the signal DIR'_B ("L" level) is input to the second input terminal thereof, and the signal IN'_A ("H" level) is input to the third input terminal thereof. The NAND circuit NAND1 performs a NAND operation, and transmits a result of the operation ("H" level) to the output circuit 130 as the signal CTL1.

The signal/DIR'_B ("H" level) is input to one input terminal of the NOR circuit NOR1, and the voltage VccA ("H" level) is applied to the other input terminal thereof. The NOR circuit NOR1 performs a NOR operation, and transmits a result of the operation ("L" level) to the node N0 as the signal CTL0.

Details of the voltage of the node N0 and the operation of the transistor TR1 are the same as those in the case of FIG. 7.

The signal /DIR'_A ("H" level) is input to the first input terminal of the NOR circuit NOR2, the signal /DIR'_B ("H" level) is input to the second input terminal thereof, and the signal IN'_A ("H" level) is input to the third input terminal thereof. The NOR circuit NOR2 performs a NOR operation, and transmits a result of the operation ("L" level) to the output circuit 130 as the signal CTL2.

Details of the operation of the transistor TR2 are the same as those in the case of FIG. 7.

The voltage of the node N1 is brought to the "H" level based on the signal CTL1 ("H" level). Since the voltage ("H" level) of the node N1 is applied to the gate of the transistor TR3, the transistor TR3 is turned off. The voltage of the node N2 is brought to the "L" level based on the signal CTL2 ("L" level). Since the voltage ("L" level) of the node N2 is applied to the gate of the transistor TR4, the transistor TR4 is turned off. The transistors TR2 to TR4 are turned off. As a result, the output circuit 130 brings the signal OUT_B to a high impedance (HZ) state.

Figure 10:
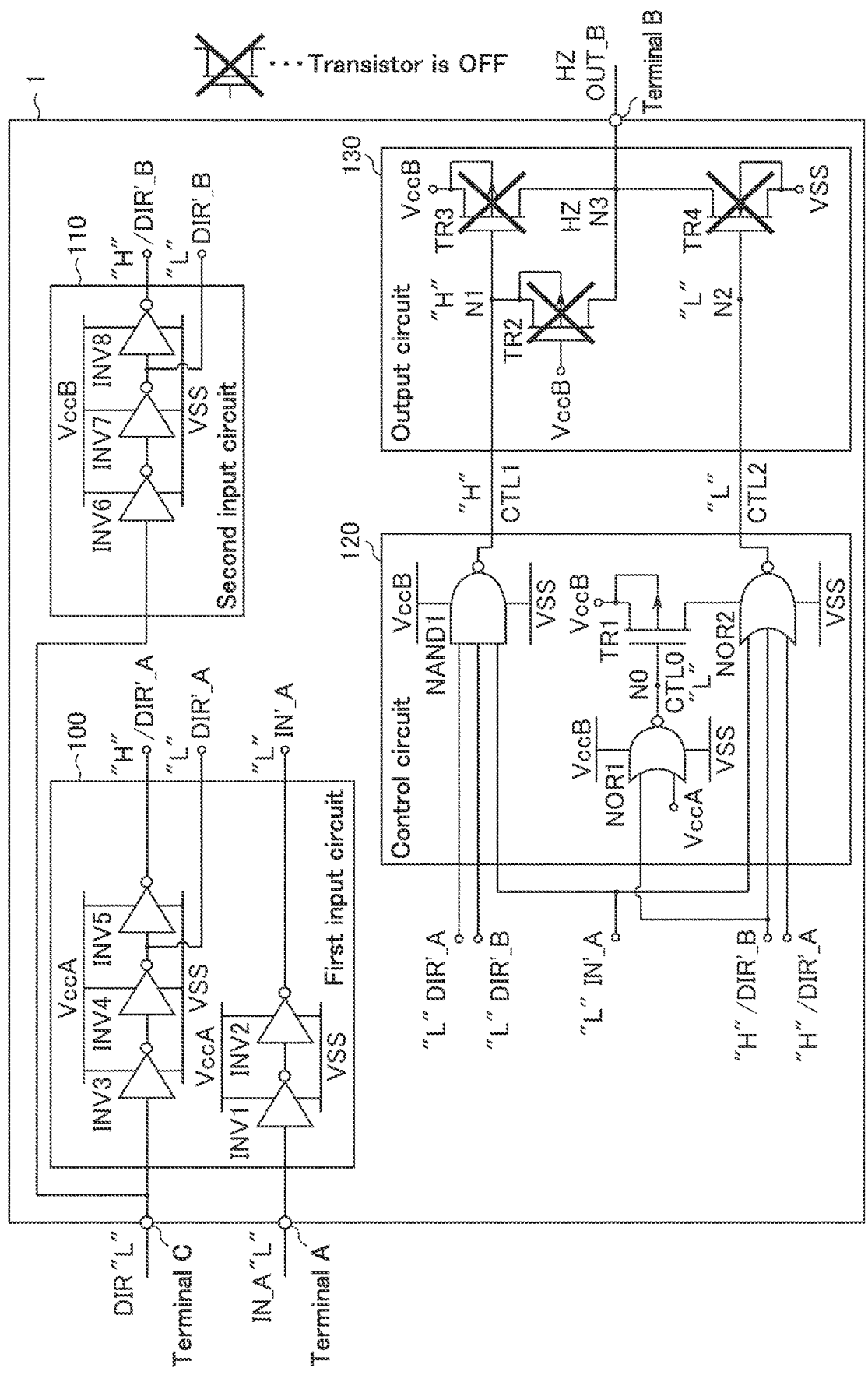
FIG. 10 illustrates an operation of the semiconductor integrated circuit according to the first embodiment.

FIG. 10 illustrates the operation of the IC 1 in the case where the voltages VccA and VccB are both at the "H" level, the signal DIR is at the "L" level, and the signal IN_A is at the "L" level. The logic levels of the signals DIR'_A, /DIR'_A, DIR'_B, /DIR'_B, and IN'_A, the voltage levels of the nodes N0 to N2, and the state of the output signal OUT_B in this case are shown in the fourth row of the truth table in FIG. 6.

As shown in FIG. 10, details of the operations of the inverter circuits INV1 and INV2 are the same as those in the case of FIG. 8. Details of the operations of the inverter circuits INV3 to INV8 are the same as those in the case of FIG. 9.

The signal DIR'_A ("L" level) is input to the first input terminal of the NAND circuit NAND1, the signal DIR'_B ("L" level) is input to the second input terminal thereof, and the signal IN'_A ("L" level) is input to the third input terminal thereof. The NAND circuit NAND1 performs a NAND operation, and transmits a result of the operation ("H" level) to the output circuit 130 as the signal CTL1.

Details of the voltage of the node N0 and the operations of the NOR circuit NOR1 and the transistor TR1 are the same as those in the case of FIG. 9.

The signal /DIR'_A ("H" level) is input to the first input terminal of the NOR circuit NOR2, the signal /DIR'_B ("H" level) is input to the second input terminal thereof, and the signal IN'_A ("L" level) is input to the third input terminal thereof. The NOR circuit NOR2 performs a NOR operation, and transmits a result of the operation ("L" level) to the output circuit 130 as the signal CTL2.

Details of the voltages of the nodes N1 and N2 and the operations of the transistors TR2 to TR4 are the same as those in the case of FIG. 9. The output circuit 130 brings the signal OUT_B to the HZ state.

The case where the voltage VccA is at the "H" level and the voltage VccB is at the "L" level will be described for each combination of the logic levels of the signal DIR and the logic levels of the signal IN_A. The truth table of this case is shown in FIG. 11.

FIG. 12 illustrates the operation of the IC 1 in the case where the voltage VccA is at the "H" level, the voltage VccB is at the "L" level, the signal DIR is at the "H" level, and the signal IN_A is at the "H" level. The logic levels of the signals DIR'_A, /DIR'_A, DIR'_B, /DIR'_B, and IN'_A, the voltage levels of the nodes N0 to N2, and the state of the output signal OUT_B in this case, are shown in the first row of the truth table in FIG. 11.

As shown in FIG. 12, details of the operations of the inverter circuits INV1 to INV5 are the same as those in the case of FIG. 7.

The inverter circuit INV6 receives the signal DIR ("H" level) from the external device. Since the voltage VccB ("H" level) is not applied to the inverter circuits INV6 to INV8, the inverter circuit INV6 transmits an "L"-level signal to the inverter circuit INV7, the inverter circuit INV7 transmits an "L"-level signal to the inverter circuit INV8 and the control circuit 120 as the signal DIR'_B, and the inverter circuit INV8 transmits an "L"-level signal to the control circuit 120 as the signal /DIR'_B.

The signal DIR'_A ("H" level) is input to the first input terminal of the NAND circuit NAND1, the signal DIR'_B ("L" level) is input to the second input terminal thereof, and the signal IN'_A ("H" level) is input to the third input terminal thereof. Since the voltage VccB ("H" level) is not applied to the NAND circuit NAND1, the NAND circuit NAND1 transmits an "L"-level signal to the output circuit 130 as the signal CTL1.

The signal /DIR'_B ("L" level) is input to one input terminal of the NOR circuit NOR1, and the voltage VccA ("H" level) is applied to the other input terminal thereof. Since the voltage VccB ("H" level) is not applied to the NOR circuit NOR1, the NOR circuit NOR1 transmits an "L"-level signal to the node N0 as the signal CTL0.

The signal CTL0 ("L" level) is input to the node N0 from the NOR circuit NOR1, and the voltage of the node N0 is brought to the "L" level. The voltage ("L" level) of the node N0 is applied to the gate of the transistor TR1, but the voltage VccB applied to one end of the transistor TR1 is at the "L" level; therefore, the transistor TR1 is turned off.

The signal /DIR'_A ("L" level) is input to the first input terminal of the NOR circuit NOR2, the signal /DIR'_B ("L" level) is input to the second input terminal thereof, and the signal IN'_A ("H" level) is input to the third input terminal thereof. Since the voltage VccB ("H" level) is not applied to the NOR circuit NOR2 via the transistor TR1, the NOR circuit NOR2 transmits an "L"-level signal to the output circuit 130 as the signal CTL2.

Since the voltage VccB ("L" level) is applied to the gate of the transistor TR2 and the signal CTL1 ("L" level) is input to the node N1 from the NAND circuit NAND1, the transistor TR2 is turned on or off in accordance with the voltage of the terminal B.

For example, when a voltage ("H" level) higher than the ground voltage VSS is not applied to the terminal B from a CPU of the external device via a bus, i.e., when the voltage of the terminal B is at the "L" level, the transistor TR2 is turned off. In this case, the voltage of the node N1 is brought to the "L" level. The voltage ("L" level) of the node N1 is applied to the gate of the transistor TR3, but the voltage VccB applied to one end of the transistor TR3 is at the "L" level; therefore, the transistor TR3 is turned off. The signal CTL2 ("L" level) is input to the node N2 from the NOR circuit NOR2, and the voltage of the node N2 is brought to the "L" level. Since the voltage ("L" level) of the node N2 is applied to the gate of the transistor TR4, the transistor TR4 is turned off. The transistors TR2 to TR4 are turned off. As a result, the signal OUT_B is brought to the HZ state.

In contrast, when a voltage ("H" level) higher than the ground voltage VSS is applied to the terminal B from the CPU of the external device via the bus, i.e., when the voltage of the terminal B is at the "H" level, the transistor TR2 is turned on. In this case, the voltage of the node N1 is brought from the "L" level to the "H" level (the voltage of the terminal B). Since the voltage ("H" level) of the node Ni is applied to the gate of the transistor TR3, the transistor TR3 is turned off. The signal CTL2 ("L" level) is input to the node N2 from the NOR circuit NOR2, and the voltage of the node N2 is brought to the "L" level. Since the voltage ("L" level) of the node N2 is applied to the gate of the transistor TR4, the transistor TR4 is turned off. The transistor TR2 is turned on, whereas the transistors TR3 and TR4 are turned off. As a result, the signal OUT_B is brought to the HZ state.

Accordingly, the output circuit 130 always brings the signal OUT_B to the HZ state regardless of the voltage of the terminal B.

Figure 13:
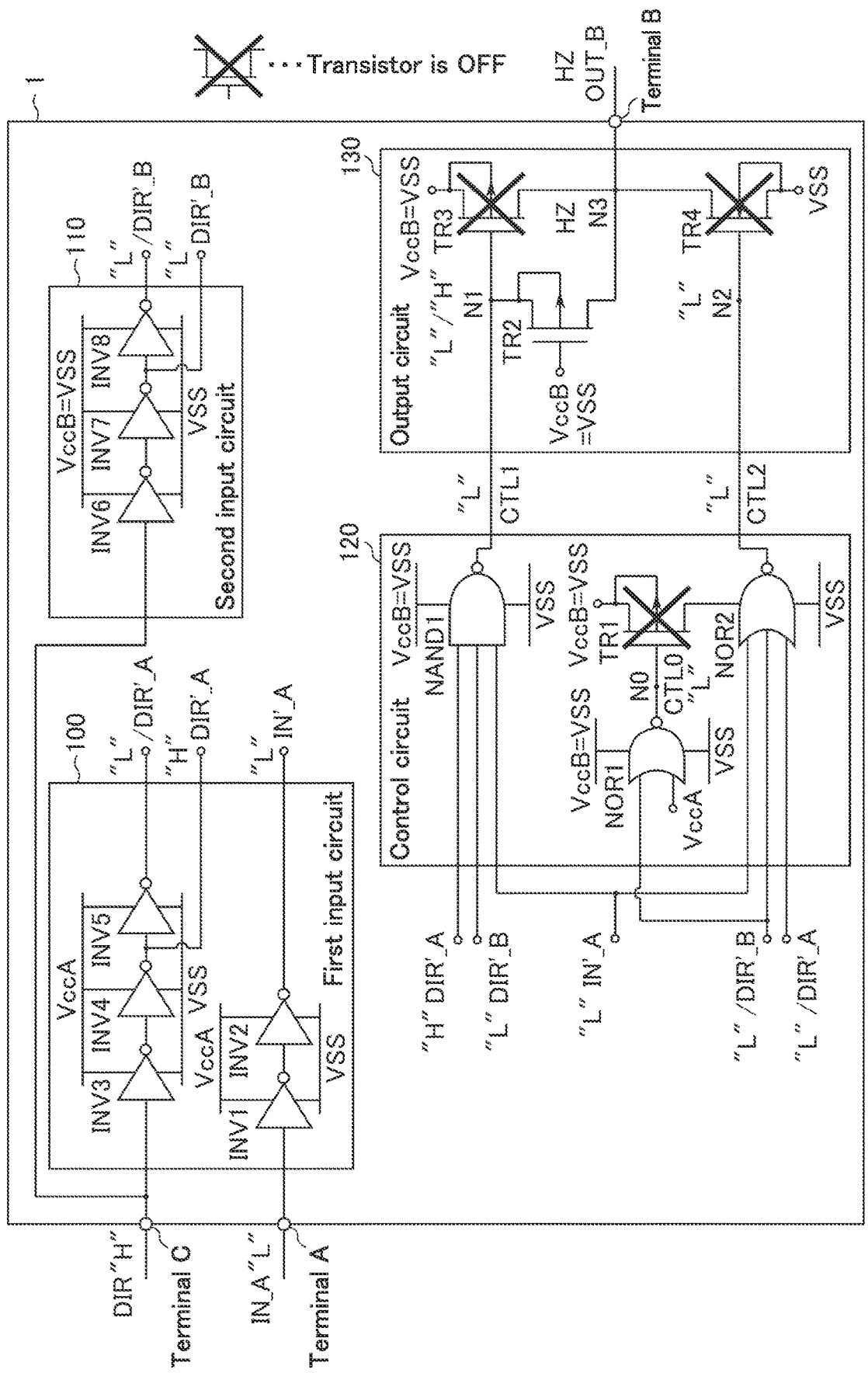
FIG. 13 illustrates an operation of the semiconductor integrated circuit according to the first embodiment.

FIG. 13 illustrates the operation of the IC 1 in the case where the voltage VccA is at the "H" level, the voltage VccB is at the "L" level, the signal DIR is at the "H" level, and the signal IN_A is at the "L" level. The logic levels of the signals DIR'_A, /DIR'_A, DIR'_B, /DIR'_B, and IN'_A, the voltage levels of the nodes N0 to N2, and the state of the output signal OUT_B in this case are shown in the second row of the truth table in FIG. 11.

As shown in FIG. 13, details of the operations of the inverter circuits INV1 to INV5 are the same as those in the case of FIG. 8. Details of the operations of the inverter circuits INV6 to INV8 are the same as those in the case of FIG. 12.

The signal DIR'_A ("H" level) is input to the first input terminal of the NAND circuit NAND1, the signal DIR'_B ("L" level) is input to the second input terminal thereof, and the signal IN'_A ("L" level) is input to the third input terminal thereof. Since the voltage VccB ("H" level) is not applied to the NAND circuit NAND1, the NAND circuit NAND1 transmits an "L"-level signal to the output circuit 130 as the signal CTL1.

Details of the voltage of the node NO and the operations of the NOR circuit NOR1 and the transistor TR1 are the same as those in the case of FIG. 12.

The signal/DIR'_A ("L" level) is input to the first input terminal of the NOR circuit NOR2, the signal/DIR'_B ("L" level) is input to the second input terminal thereof, and the signal IN'_A ("L" level) is input to the third input terminal thereof. Since the voltage VccB ("H" level) is not applied to the NOR circuit NOR2 via the transistor TR1, the NOR circuit NOR2 transmits an "L"-level signal to the output circuit 130 as the signal CTL2.

Details of the voltages of the nodes N1 and N2 and the operations of the transistors TR2 to TR4 are the same as those in the case of FIG. 12. The output circuit 130 brings the signal OUT_B to the HZ state.

Figure 14:
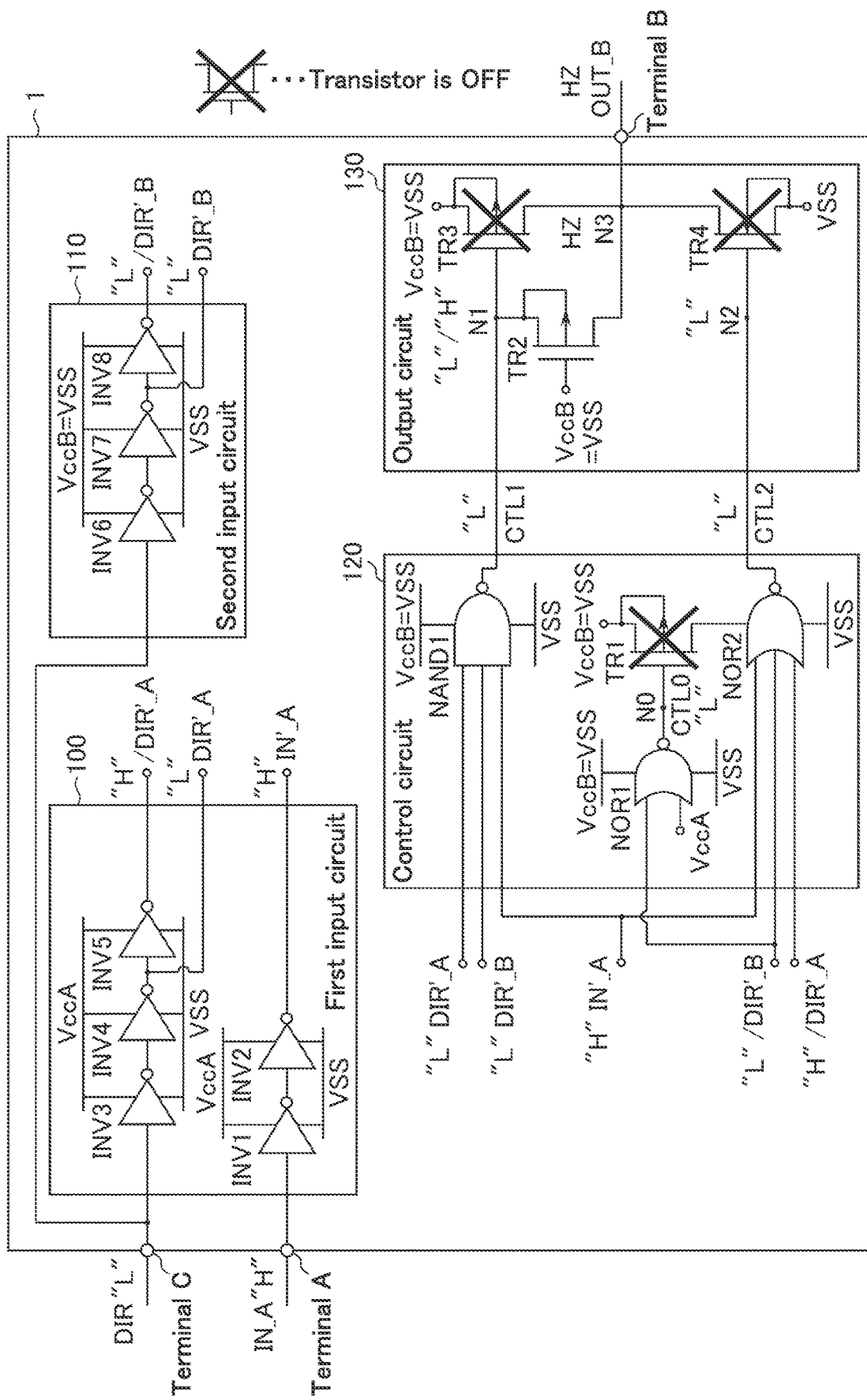
FIG. 14 illustrates an operation of the semiconductor integrated circuit according to the first embodiment.

FIG. 14 illustrates the operation of the IC 1 in the case where the voltage VccA is at the "H" level, the voltage VccB is at the "L" level, the signal DIR is at the "L" level, and the signal IN_A is at the "H" level. The logic levels of the signals DIR'_A, /DIR'_A, DIR'_B, /DIR'_B, and IN'_A, the voltage levels of the nodes N0 to N2, and the state of the output signal OUT_B in this case are shown in the third row of the truth table in FIG. 11.

As shown in FIG. 14, details of the operations of the inverter circuits INV1 and INV2 are the same as those in the case of FIG. 7. Details of the operations of the inverter circuits INV3 to INV5 are the same as those in the case of FIG. 9.

The inverter circuit INV6 receives the signal DIR ("L" level) from the external device. Since the voltage VccB ("H" level) is not applied to the inverter circuits INV6 to INV8, the inverter circuit INV6 transmits an "L"-level signal to the inverter circuit INV7, the inverter circuit INV7 transmits an "L"-level signal to the inverter circuit INV8 and the control circuit 120 as the signal DIR'_B, and the inverter circuit INV8 transmits an "L"-level signal to the control circuit 120 as the signal/DIR'_B.

The signal DIR'_A ("L" level) is input to the first input terminal of the NAND circuit NAND1, the signal DIR'_B ("L" level) is input to the second input terminal thereof, and the signal IN'_A ("H" level) is input to the third input terminal thereof. Since the voltage VccB ("H" level) is not applied to the NAND circuit NAND1, the NAND circuit NAND1 transmits an "L"-level signal to the output circuit 130 as the signal CTL1.

Details of the voltage of the node NO and the operations of the NOR circuit NOR1 and the transistor TR1 are the same as those in the case of FIG. 12.

The signal/DIR'_A ("H" level) is input to the first input terminal of the NOR circuit NOR2, the signal/DIR'_B ("L" level) is input to the second input terminal thereof, and the signal IN'_A ("H" level) is input to the third input terminal thereof. Since the voltage VccB ("H" level) is not applied to the NOR circuit NOR2 via the transistor TR1, the NOR circuit NOR2 transmits an "L"-level signal to the output circuit 130 as the signal CTL2.

Details of the voltages of the nodes N1 and N2 and the operations of the transistors TR2 to TR4 are the same as those in the case of FIG. 12. The output circuit 130 brings the signal OUT_B to the HZ state.

Figure 15:
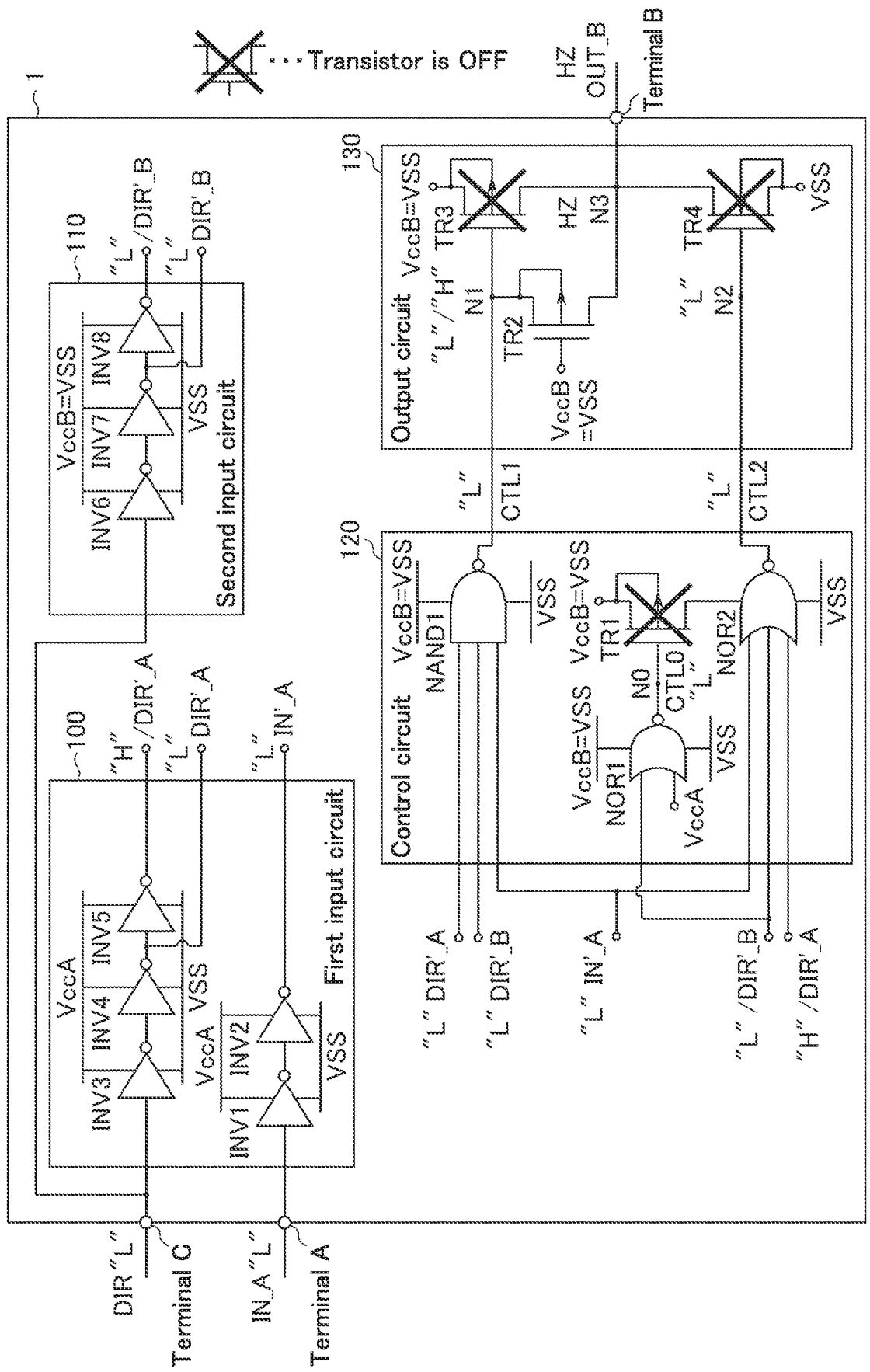
FIG. 15 illustrates an operation of the semiconductor integrated circuit according to the first embodiment.

FIG. 15 illustrates the operation of the IC 1 in the case where the voltage VccA is at the "H" level, the voltage VccB is at the "L" level, the signal DIR is at the "L" level, and the signal IN_A is at the "L" level. The logic levels of the signals DIR'_A, /DIR'_A, DIR'_B, /DIR'_B, and IN'_A, the voltage levels of the nodes N0 to N2, and the state of the output signal OUT_B in this case are shown in the fourth row of the truth table in FIG. 11.

As shown in FIG. 15, details of the operations of the inverter circuits INV1 and INV2 are the same as those in the case of FIG. 8. Details of the operations of the inverter circuits INV3 to INV5 are the same as those in the case of FIG. 9. Details of the operations of the inverter circuits INV6 to INV8 are the same as those in the case of FIG. 14.

The signal DIR'_A ("L" level) is input to the first input terminal of the NAND circuit NAND1, the signal DIR'_B ("L" level) is input to the second input terminal thereof, and the signal IN'_A ("L" level) is input to the third input terminal thereof. Since the voltage VccB ("H" level) is not applied to the NAND circuit NAND1, the NAND circuit NAND1 transmits an "L"-level signal to the output circuit 130 as the signal CTL1.

Details of the voltage of the node NO and the operations of the NOR circuit NOR1 and the transistor TR1 are the same as those in the case of FIG. 12.

The signal/DIR'_A ("H" level) is input to the first input terminal of the NOR circuit NOR2, the signal/DIR'_B ("L" level) is input to the second input terminal thereof, and the signal IN'_A ("L" level) is input to the third input terminal thereof. Since the voltage VccB ("H" level) is not applied to the NOR circuit NOR2 via the transistor TR1, the NOR circuit NOR2 transmits an "L"-level signal to the output circuit 130 as the signal CTL2.

Details of the voltages of the nodes N1 and N2 and the operations of the transistors TR2 to TR4 are the same as those in the case of FIG. 12. The output circuit 130 brings the signal OUT_B to the HZ state.

Next, the case where the voltage VccA is at the "L" level and the voltage VccB is at the "H" level will be described for each combination of the logic levels of the signal DIR and the logic levels of the signal IN_A. The truth table of this case is shown in FIG. 16.

FIG. 17 illustrates the operation of the IC 1 in the case where the voltage VccA is at the "L" level, the voltage VccB is at the "H" level, the signal DIR is at the "H" level, and the signal IN_A is at the "H" level. The logic levels of the signals DIR'_A, /DIR'_A, DIR'_B, /DIR'_B, and IN'_A, the voltage levels of the nodes N0 to N2, and the state of the output signal OUT_B in this case are shown in the first row of the truth table in FIG. 16.

As shown in FIG. 17, the inverter circuit INV1 receives the signal IN_A ("H" level) from the external device. Since the voltage VccA ("H" level) is not applied to the inverter circuits INV1 and INV2, the inverter circuit INV1 transmits an "L"-level signal to the inverter circuit INV2, and the inverter circuit INV2 transmits an "L"-level signal to the control circuit 120 as the signal IN'_A.

The inverter circuit INV3 receives the signal DIR ("H" level) from the external device. Since the voltage VccA ("H" level) is not applied to the inverter circuits INV3 to INV5, the inverter circuit INV3 transmits an "L"-level signal to the inverter circuit INV4, the inverter circuit INV4 transmits an "L"-level signal to the inverter circuit INV5 and the control circuit 120 as the signal DIR'_A, and the inverter circuit INV5 transmits an "L"-level signal to the control circuit 120 as the signal /DIR'_A.

Details of the operations of the inverter circuits INV6 to INV8 are the same as those in the case of FIG. 7.

The signal DIR'_A ("L" level) is input to the first input terminal of the NAND circuit NAND1, the signal DIR'_B ("H" level) is input to the second input terminal thereof, and the signal IN'_A ("L" level) is input to the third input terminal thereof. The NAND circuit NAND1 performs a NAND operation, and transmits a result of the operation ("H" level) to the output circuit 130 as the signal CTL1.

The signal /DIR'_B ("L" level) is input to one input terminal of the NOR circuit NOR1, and the voltage VccA ("L" level) is applied to the other input terminal thereof. The NOR circuit NOR1 performs a NOR operation, and transmits a result of the operation ("H" level) to the node N0 as the signal CTL0.

The signal CTL0 ("H" level) is input to the node N0 from the NOR circuit NOR1, and the voltage of the node N0 is brought to the "H" level. Since the voltage ("H" level) of the node N0 is applied to the gate of the transistor TR1, the transistor TR1 is turned off.

The signal /DIR'_A ("L" level) is input to the first input terminal of the NOR circuit NOR2, the signal /DIR'_B ("L" level) is input to the second input terminal thereof, and the signal IN'_A ("L" level) is input to the third input terminal thereof. Since the voltage VccB ("H" level) is not applied to the NOR circuit NOR2 via the transistor TR1, the NOR circuit NOR2 transmits an "L"-level signal to the output circuit 130 as the signal CTL2.

Details of the voltages of the nodes N1 and N2 and the operations of the transistors TR2 to TR4 are the same as those in the case of FIG. 9. The output circuit 130 brings the signal OUT_B to the HZ state.

Figure 18:
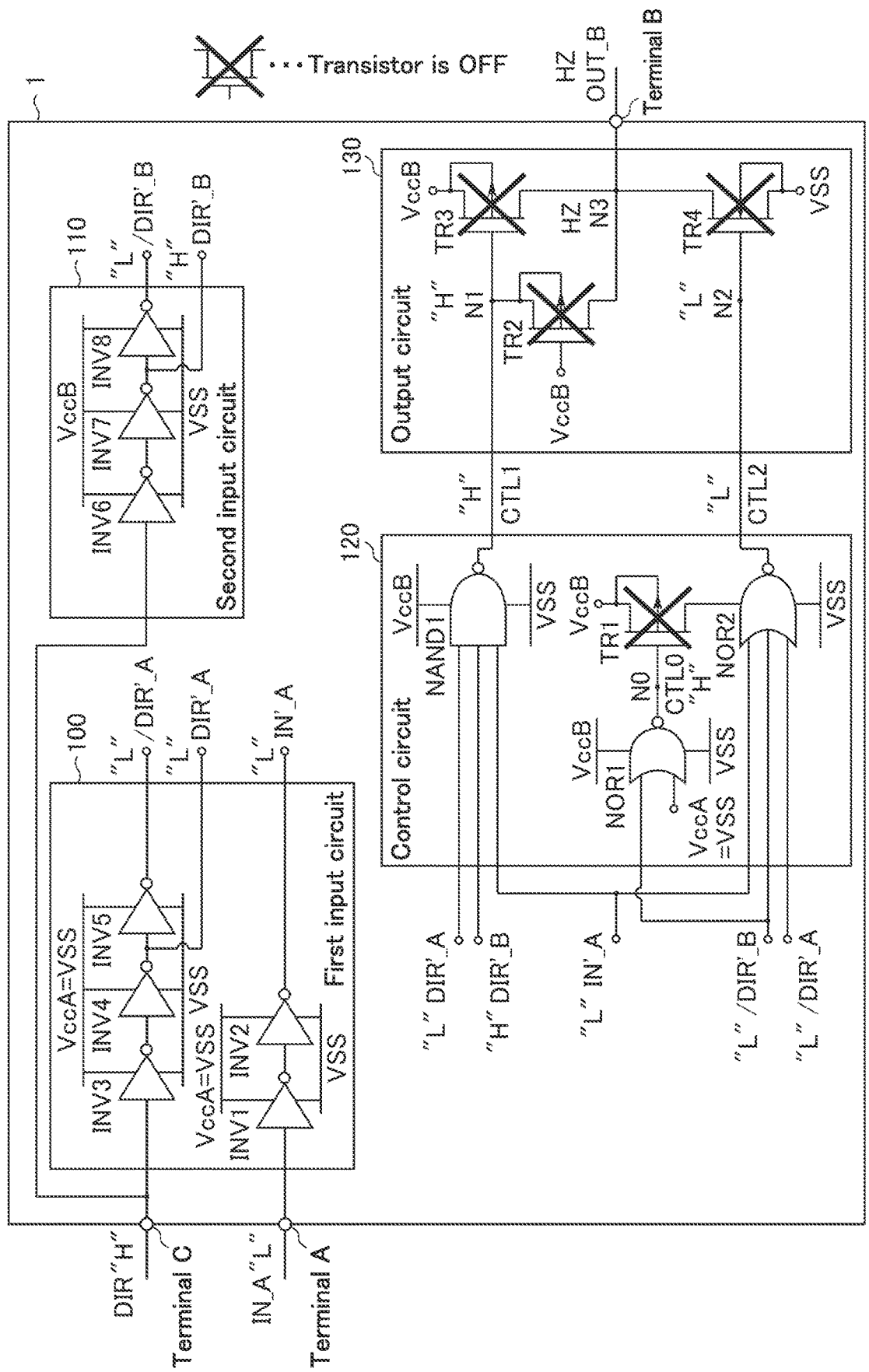
FIG. 18 illustrates an operation of the semiconductor integrated circuit according to the first embodiment.

FIG. 18 illustrates the operation of the IC 1 in the case where the voltage VccA is at the "L" level, the voltage VccB is at the "H" level, the signal DIR is at the "H" level, and the signal IN_A is at the "L" level. The logic levels of the signals DIR'_A, /DIR'_A, DIR'_B, /DIR'_B, and IN'_A, the voltage levels of the nodes N0 to N2, and the state of the output signal OUT_B in this case are shown in the second row of the truth table in FIG. 16.

As shown in FIG. 18, the inverter circuit INV1 receives the signal IN_A ("L" level) from the external device. Since the voltage VccA ("H" level) is not applied to the inverter circuits INV1 and INV2, the inverter circuit INV1 transmits an "L"-level signal to the inverter circuit INV2, and the inverter circuit INV2 transmits an "L"-level signal to the control circuit 120 as the signal IN'_A.

Details of the operations of the inverter circuits INV3 to INV5 are the same as those in the case of FIG. 17. Details of the operations of the inverter circuits INV6 to INV8 are the same as those in the case of FIG. 7.

Details of the voltage of the node N0 and the operations of the NAND circuit NAND1, the NOR circuit NOR1, the transistor TR1, and the NOR circuit NOR2 are the same as those in the case of FIG. 17.

Details of the voltages of the nodes N1 and N2 and the operations of the transistors TR2 to TR4 are the same as those in the case of FIG. 17. The output circuit 130 brings the signal OUT_B to the HZ state.

Figure 19:
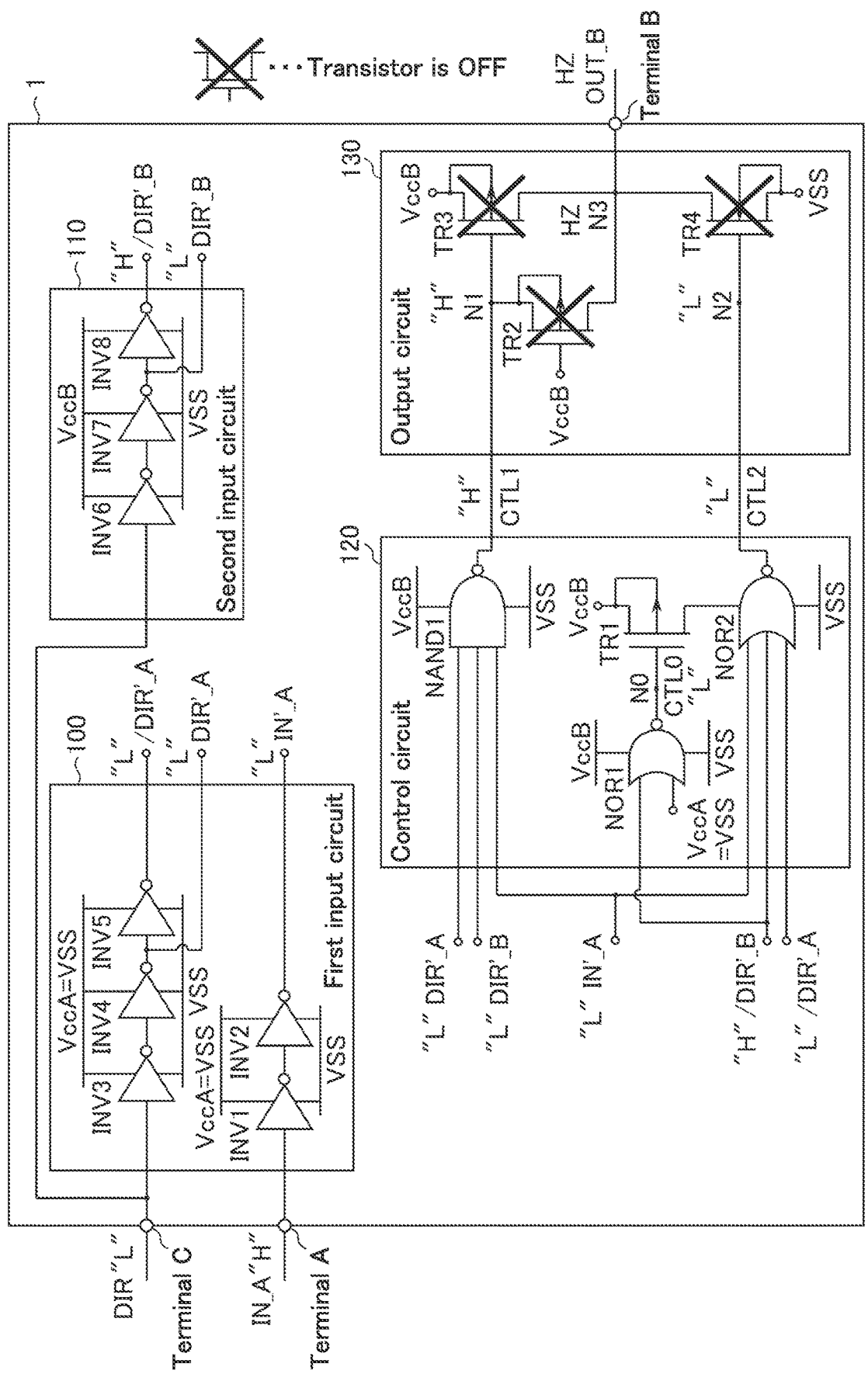
FIG. 19 illustrates an operation of the semiconductor integrated circuit according to the first embodiment.

FIG. 19 illustrates the operation of the IC 1 in the case where the voltage VccA is at the "L" level, the voltage VccB is at the "H" level, the signal DIR is at the "L" level, and the signal IN_A is at the "H" level. The logic levels of the signals DIR'_A, /DIR'_A, DIR'_B, /DIR'_B, and IN'_A, the voltage levels of the nodes N0 to N2, and the state of the output signal OUT_B in this case are shown in the third row of the truth table in FIG. 16.

As shown in FIG. 19, details of the operations of the inverter circuits INV1 and INV2 are the same as those in the case of FIG. 17.

The inverter circuit INV3 receives the signal DIR ("L" level) from the external device. Since the voltage VccA ("H" level) is not applied to the inverter circuits INV3 to INV5, the inverter circuit INV3 transmits an "L"-level signal to the inverter circuit INV4, the inverter circuit INV4 transmits an "L"-level signal to the inverter circuit INV5 and the control circuit 120 as the signal DIR'_A, and the inverter circuit INV5 transmits an "L"-level signal to the control circuit 120 as the signal /DIR'_A.

Details of the operations of the inverter circuits INV6 to INV8 are the same as those in the case of FIG. 9.

The signal DIR'_A ("L" level) is input to the first input terminal of the NAND circuit NAND1, the signal DIR'_B ("L" level) is input to the second input terminal thereof, and the signal IN'_A ("L" level) is input to the third input terminal thereof. The NAND circuit NAND1 performs a NAND operation, and transmits a result of the operation ("H" level) to the output circuit 130 as the signal CTL1.

The signal /DIR'_B ("H" level) is input to one input terminal of the NOR circuit NOR1, and the voltage VccA ("L" level) is applied to the other input terminal thereof. The NOR circuit NOR1 performs a NOR operation, and transmits a result of the operation ("L" level) to the node N0 as the signal CTL0.

Details of the voltage of the node N0 and the operation of the transistor TR1 are the same as those in the case of FIG. 7.

The signal /DIR'_A ("L" level) is input to the first input terminal of the NOR circuit NOR2, the signal /DIR'_B ("H" level) is input to the second input terminal thereof, and the signal IN'_A ("L" level) is input to the third input terminal thereof. The NOR circuit NOR2 performs a NOR operation, and transmits a result of the operation ("L" level) to the output circuit 130 as the signal CTL2.

Details of the voltages of the nodes N1 and N2 and the operations of the transistors TR2 to TR4 are the same as those in the case of FIG. 9. The output circuit 130 brings the signal OUT_B to the HZ state.

Figure 20:
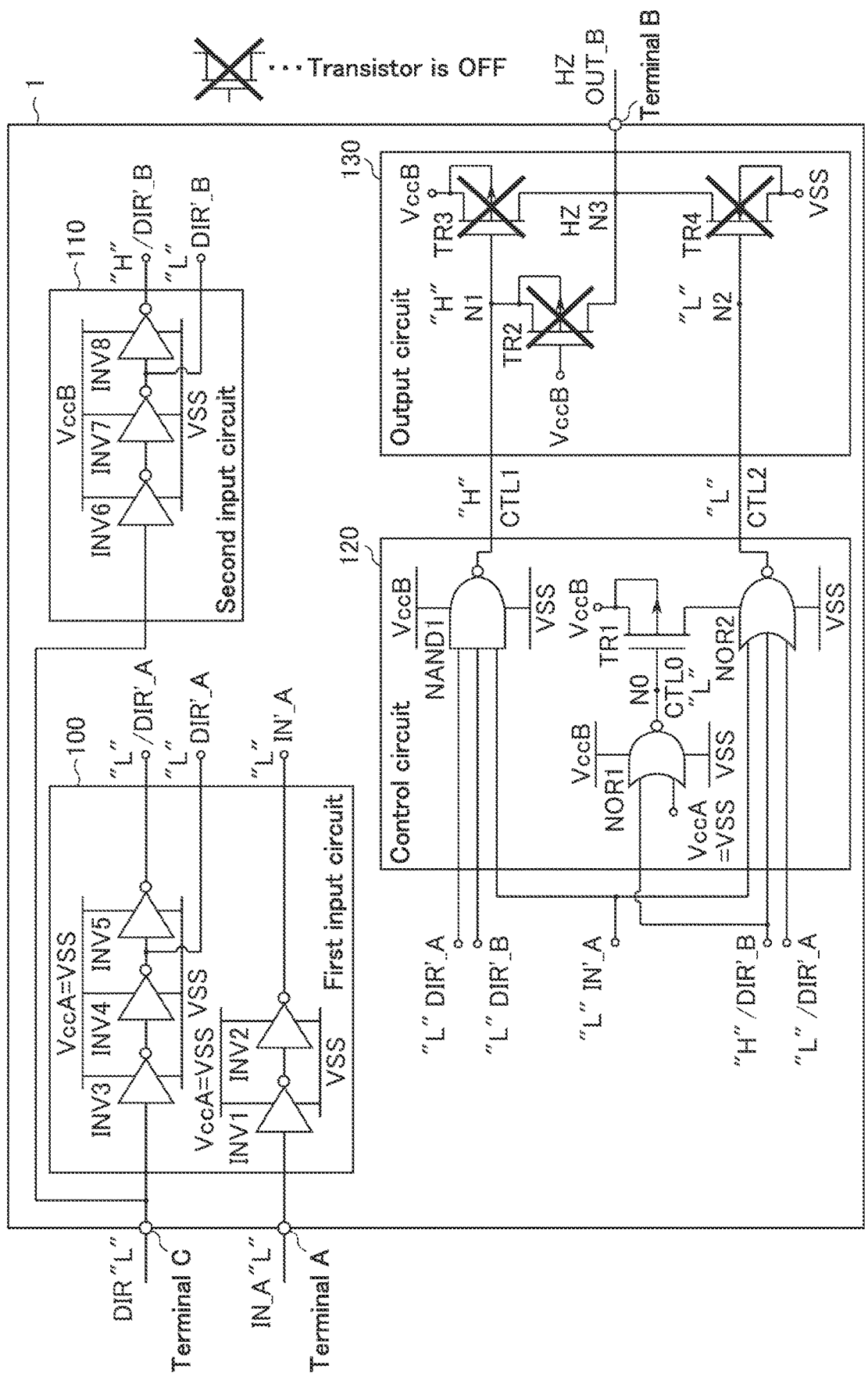
FIG. 20 illustrates an operation of the semiconductor integrated circuit according to the first embodiment.

FIG. 20 illustrates the operation of the IC 1 in the case where the voltage VccA is at the "L" level, the voltage VccB is at the "H" level, the signal DIR is at the "L" level, and the signal IN_A is at the "L" level. The logic levels of the signals DIR'_A, /DIR'_A, DIR'_B, /DIR'_B, and IN'_A, the voltage levels of the nodes N0 to N2, and the state of the output signal OUT_B in this case are shown in the fourth row of the truth table in FIG. 16.

As shown in FIG. 20, details of the operations of the inverter circuits INV1 and INV2 are the same as those in the case of FIG. 18. Details of the operations of the inverter circuits INV3 to INV5 are the same as those in the case of FIG. 19. Details of the operations of the inverter circuits INV6 to INV8 are the same as those in the case of FIG. 9.

Details of the voltage of the node N0 and the operations of the NAND circuit NAND1, the NOR circuit NOR1, the transistor TR1, and the NOR circuit NOR2 are the same as those in the case of FIG. 19.

Details of the voltages of the nodes N1 and N2 and the operations of the transistors TR2 to TR4 are the same as those in the case of FIG. 19. The output circuit 130 brings the signal OUT_B to the HZ state.

1.3 Advantageous Effects

The IC 1 according to the present embodiment includes the second input circuit 110 in order to control the voltage of the node N2 when the voltage VccA is not applied. Therefore, when the voltage VccA is not applied and the signal DIR is at the "L" level, the voltage of the node N2 can be brought to the "L" level and the signal OUT_B is brought to the HZ state.

The IC 1 according to the present embodiment also includes, in the control circuit 120, the NOR circuit NOR1 and the transistor TR1 in order to control the voltage of the node N2 when the voltage VccA is not applied. Therefore, when the voltage VccA is not applied and the signal DIR is at the "H" level, the voltage of the node N2 can be brought to the "L" level and the signal OUT_B is brought to the HZ state.

The IC 1 according to the present embodiment also includes, in the output circuit 130, the transistor TR2 in order to control the voltage of the node N1 when the voltage VccB is not applied. Therefore, when the voltage VccB is not applied, the voltage of the node N1 can be brought to the "H" level and the signal OUT_B is brought to the HZ state.

The configuration according to the present embodiment can control the output signal OUT_B from the terminal B to be in the high impedance state under the condition where at least one of the voltages VccA and VccB is not applied to the IC 1, and thus can improve the operation reliability of the IC 1.

2 Second Embodiment

An IC 1 according to a second embodiment will be described. The IC 1 according to the present embodiment has a circuit configuration to transmit a signal input to the terminal B from the terminal B to the terminal A in addition to the circuit configuration of the IC 1 according to the first embodiment to transmit a signal input to the terminal A from the terminal A to the terminal B. Hereinafter, the points that are different from the first embodiment will be mainly described.

2.1 Configuration 2.1.1 Overall Configuration of IC 1

First, an overall configuration of the IC 1 according to the present embodiment will be described with reference to FIG. 21.

Figure 21:
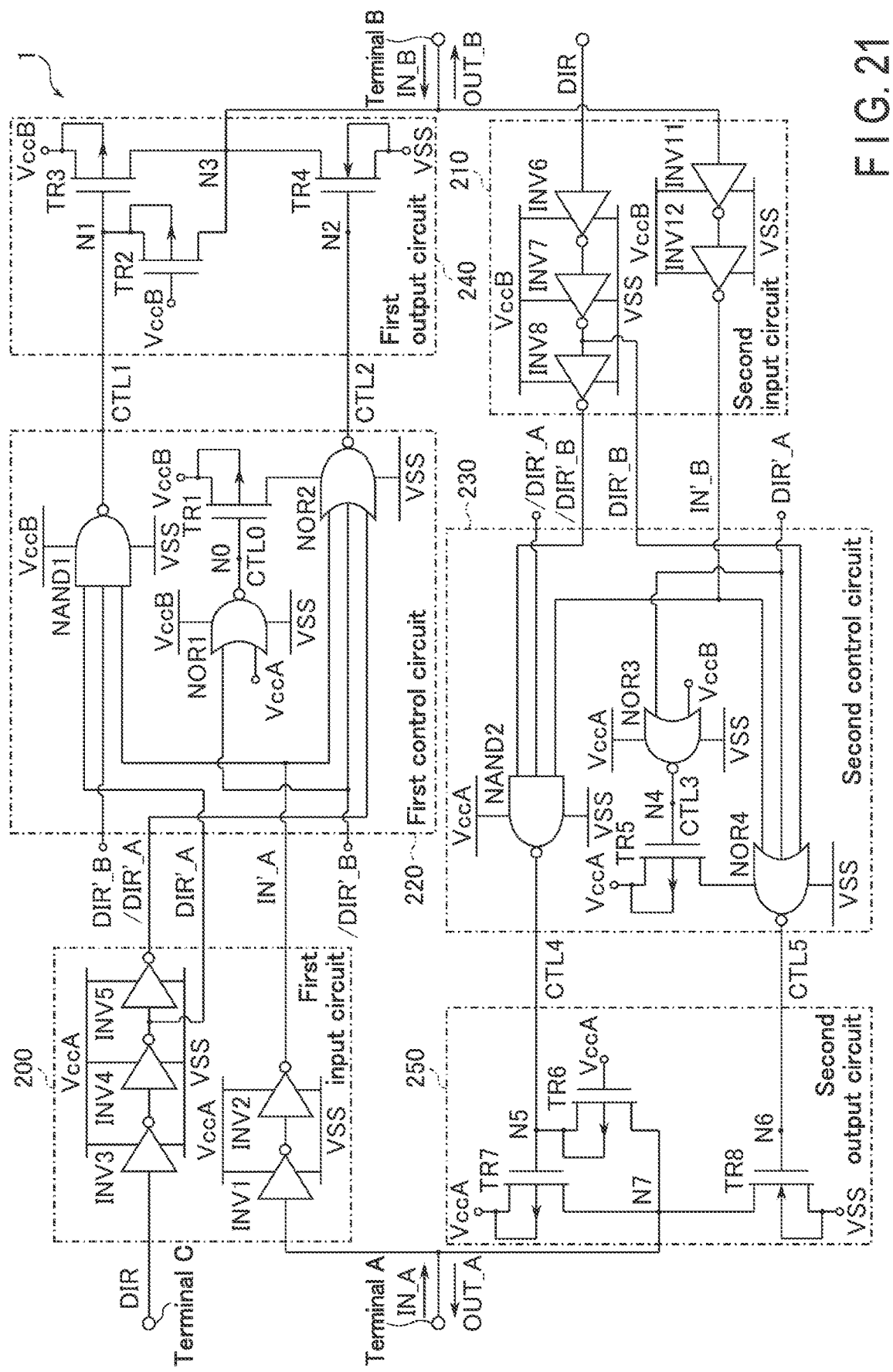
FIG. 21 is a circuit diagram of a semiconductor integrated circuit according to a second embodiment.

FIG. 21 is a circuit diagram showing an example of the IC 1 according to the present embodiment. The IC 1 has a configuration obtained by modifying the IC 1 in FIG. 1 described in the first embodiment to further include a second control circuit 230 and a second output circuit 250. The second input circuit 210 corresponds to the second input circuit 110 in FIG. 1, but has a configuration different from the configuration of the second input circuit 110 in FIG. 3 described in the first embodiment. Details of the second input circuit 210, the second control circuit 230, and the second output circuit 250 will be described later. The first input circuit 200 corresponds to the first input circuit 100 in FIG. 1, and has the same configuration as the configuration of the first input circuit 100 in FIG. 2 described in the first embodiment. The first control circuit 220 corresponds to the control circuit 120 in FIG. 1, and has the same configuration as the configuration of the control circuit 120 in FIG. 4 described in the first embodiment. The first output circuit 240 corresponds to the output circuit 130 in FIG. 1, and has the same configuration as the configuration of the output circuit 130 in FIG. 5 described in the first embodiment. Like the IC 1 in FIG. 1, the IC 1 has a VccA terminal, a VccB terminal, a VSS terminal, a terminal A, a terminal B, and a terminal C.

2.1.2 Configuration of Second Input Circuit 210

The second input circuit 210 operates using the voltage VccB as the operating voltage. The second input circuit 210 receives signals IN_B and DIR from an external device. The second input circuit 210 generates a signal IN'_B based on the received signal IN_B, and transmits the generated signal IN'_B to the second control circuit 230. The second input circuit 210 also generates signals DIR'_B and/DIR'_B based on the received signal DIR, and transmits the generated signals DIR'_B and/DIR'_B to the first control circuit 220 and the second control circuit 230.

The second input circuit 210 has a configuration obtained by modifying the second input circuit 110 in FIG. 3 to further include inverter circuits INV11 and INV12.

The inverter circuit INV11 receives the input signal IN_B from the external device via the terminal B. The inverter circuit INV11 transmits a signal obtained by inverting the logic level of the received signal to the inverter circuit INV12.

The inverter circuit INV12 receives the signal from the inverter circuit INV11. The inverter circuit INV12 transmits a signal obtained by inverting the logic level of the received signal to the second control circuit 230 as the signal IN'_B.

The number of inverter circuits INV included in the second input circuit 210 is not limited to five. In the second input circuit 210, the number of inverter circuits INV coupled to the terminal B may be any even number, and the number of inverter circuits INV coupled to the terminal C may be any odd number.

2.1.3 Configuration of Second Control Circuit 230

The second control circuit 230 operates using the voltage VccA as the operating voltage. The second control circuit 230 controls the operation of the second output circuit 250. Specifically, the second control circuit 230 generates control signals CTL4 and CTL5 based on the signals IN'_B, DIR'_B, /DIR'_B, DIR'_A, and/DIR'_A received from the second input circuit 210, and transmits the generated signals CTL4 and CTL5 to the second output circuit 250. The control signals CTL4 and CTL5 are signals for controlling the second output circuit 250.

The second control circuit 230 includes a NAND circuit NAND2, NOR circuits NOR3 and NOR4, and a p-channel MOS transistor TR5.

The NAND circuit NAND2 operates using the voltage VccA as the operating voltage. The NAND circuit NAND2 has three input terminals. The signal/DIR'_B is input to the first input terminal of the NAND circuit NAND2, the signal/DIR'_A is input to the second input terminal thereof, and the signal IN'_B is input to the third input terminal thereof. The NAND circuit NAND2 performs a NAND operation based on the signals /DIR'_B, /DIR'_A, and IN'_B. The NAND circuit NAND2 transmits a result of the operation to the second output circuit 250 as the signal CTL4.

The NOR circuit NOR3 operates using the voltage VccA as the operating voltage. The NOR circuit NOR3 has two input terminals. The signal DIR'_A is input to one input terminal of the NOR circuit NOR3, and the voltage VccB is applied to the other input terminal thereof. The NOR circuit NOR3 performs a NOR operation based on the signal DIR'_A and the voltage VccB. The NOR circuit NOR3 transmits a result of the operation to a node N4 as the signal CTL3.

The gate of the transistor TR5 is coupled to the node N4. The voltage VccA is applied to one end of the transistor TR5. The other end of the transistor TR5 is coupled to a supply terminal of the NOR circuit NOR4, and the voltage VccA is applied to the NOR circuit NOR4 when the transistor TR5 is ON.

The NOR circuit NOR4 operates using the voltage VccA as the operating voltage. The NOR circuit NOR4 has three input terminals. The signal DIR'_B is input to the first input terminal of the NOR circuit NOR4, the signal DIR'_A is input to the second input terminal thereof, and the signal IN'_B is input to the third input terminal thereof. The NOR circuit NOR4 performs a NOR operation based on the signals DIR'_B, DIR'_A, and IN'_B. The NOR circuit NOR4 transmits a result of the operation to the second output circuit 250 as the signal CTL5.

2.1.4 Configuration of Second Output Circuit 250

The second output circuit 250 operates using the voltage VccA as the operating voltage. The second output circuit 250 outputs a signal OUT_A to the external device based on the signals CTL4 and CTL5 received from the second control circuit 230.

The second output circuit 250 includes p-channel MOS transistors TR6 and TR7 and an n-channel MOS transistor TR8.

The voltage VccA is applied to the gate of the transistor TR6. One end of the transistor TR6 is coupled to the node N5. The signal CTL4 is input to the node N5 from the second control circuit 230. The other end of the transistor TR6 is coupled to the node N7.

The gate of the transistor TR7 is coupled to the node N5. The voltage VccA is applied to one end of the transistor TR7. The other end of the transistor TR7 is coupled to the node N7.

The gate of the transistor TR8 is coupled to the node N6. The signal CTL5 is input to the node N6 from the second control circuit 230. One end of the transistor TR8 is coupled to the node N7. The ground voltage VSS is applied to the other end of the transistor TR8.

The second output circuit 250 outputs the signal OUT_A to the external device via the terminal A.

2.2 Operation

Next, the operation of the IC 1 according to the present embodiment will be described with reference to FIGS. 22 to 24. FIGS. 22 to 24 are truth tables of the IC 1 according to the present embodiment in operation.

(1) Where the voltages VccA and VccB are both at the "H" level

The case where the voltages VccA and VccB are both at the "H" level will be described.

(1-1) Where the signal DIR is at the "H" level and the signal IN_A is at the "H" level The state of the signal IN_B, the logic levels of the signals DIR'_A, /DIR'_A, DIR'_B, /DIR'_B, IN'_A, and IN'_B, the voltage levels of the nodes N0 to N2 and N4 to N6, and the states of the signals OUT_A and OUT_B in this case are shown in the first row of the truth table in FIG. 22. Since the signal DIR is at the "H" level, the signal IN_A is transmitted from the terminal A to the terminal B. How the signal is transmitted from the terminal A to the terminal B is the same as that shown in FIG. 7 described in the first embodiment. The signal IN_A is transmitted from the terminal A to the terminal B as shown in FIG. 7, the terminal B is brought to the "H" level, and the signal OUT_B at the "H" level is output from the terminal B.

The inverter circuit INV6 receives the signal DIR ("H" level) from the external device. Since the voltage VccB ("H" level) is applied to the inverter circuits INV6 to INV8, the inverter circuit INV6 transmits an "L"-level signal to the inverter circuit INV7, the inverter circuit INV7 transmits an "H"-level signal to the inverter circuit INV8, the first control circuit 220, and the second control circuit 230 as the signal DIR'_B, and the inverter circuit INV8 transmits an "L"-level signal to the first control circuit 220 and the second control circuit 230 as the signal/DIR'_B.

Since the terminal B is at the "H" level, the inverter circuit INV11 receives an "H"-level signal from the terminal B as the signal IN_B. Since the voltage VccB ("H" level) is applied to the inverter circuits INV11 and INV12, the inverter circuit INV11 transmits an "L"-level signal to the inverter circuit TNV12, and the inverter circuit INV12 transmits an "H"-level signal to the second control circuit 230 as the signal IN'_B.

The signal/DIR'_B ("L" level) is input to the first input terminal of the NAND circuit NAND2, the signal/DIR'_A ("L" level) is input to the second input terminal thereof, and the signal IN'_B ("H" level) is input to the third input terminal thereof. Since the voltage VccA ("H" level) is applied to the NAND circuit NAND2, the NAND circuit NAND2 performs a NAND operation, and transmits a result of the operation ("H" level) to the second output circuit 250 as the signal CTL4.

The signal DIR'_A ("H" level) is input to one input terminal of the NOR circuit NOR3, and the voltage VccB ("H" level) is applied to the other input terminal thereof. Since the voltage VccA ("H" level) is applied to the NOR circuit NOR3, the NOR circuit NOR3 performs a NOR operation, and transmits a result of the operation ("L" level) to the node N4 as the signal CTL3.

The voltage of the node N4 is brought to the "L" level based on the signal CTL3 ("L" level). Since the voltage ("L" level) of the node N4 is applied to the gate of the transistor TR5 and the voltage VccA ("H" level) is applied to one end of the transistor TR5, the transistor TR5 is turned on.

The signal DIR'_B ("H" level) is input to the first input terminal of the NOR circuit NOR4, the signal DIR'_A ("H" level) is input to the second input terminal thereof, and the signal IN'_B ("H" level) is input to the third input terminal thereof. Since the voltage VccA ("H" level) is applied to the NOR circuit NOR4 via the transistor TR5, the NOR circuit NOR4 performs a NOR operation, and transmits a result of the operation ("L" level) to the second output circuit 250 as the signal CTL5.

Since the voltage VccA ("H" level) is applied to the gate of the transistor TR6, the transistor TR6 is turned off.

The voltage of the node N5 is brought to the "H" level based on the signal CTL4 ("H" level). Since the voltage ("H" level) of the node N5 is applied to the gate of the transistor TR7, the transistor TR7 is turned off. The voltage of the node N6 is brought to the "L" level based on the signal CTL5 ("L" level). Since the voltage ("L" level) of the node N6 is applied to the gate of the transistor TR8, the transistor TR8 is turned off. The transistors TR6 to TR8 are turned off. As a result, the terminal A is brought to the HZ state, and the second output circuit 250 brings the signal OUT_A to the HZ state.

(1-2) Where the signal DIR is at the "H" level and the signal IN_A is at the "L" level The state of the signal IN_B, the logic levels of the signals DIR'_A, /DIR'_A, DIR'_B, /DIR'_B, IN'_A, and IN'_B, the voltage levels of the nodes N0 to N2 and N4 to N6, and the states of the signals OUT_A and OUT_B in this case are shown in the second row of the truth table in FIG. 22. How the signal is transmitted from the terminal A to the terminal B is the same as that shown in FIG. 8 described in the first embodiment. The signal IN_A is transmitted from the terminal A to the terminal B as shown in FIG. 8, the terminal B is brought to the "L" level, and the signal OUT_B at the "L" level is output from the terminal B.

Details of the operations of the inverter circuits INV6 to INV8 are the same as those in the case of (1-1) above.

Since the terminal B is at the "L" level, the inverter circuit INV11 receives an "L" level signal from the terminal B as the signal IN_B. Since the voltage VccB ("H" level) is applied to the inverter circuits INV11 and INV12, the inverter circuit INV11 transmits an "H"-level signal to the inverter circuit INV12, and the inverter circuit INV12 transmits an "L"-level signal to the second control circuit 230 as the signal IN'_B.

The signal/DIR'_B ("L" level) is input to the first input terminal of the NAND circuit NAND2, the signal/DIR'_A ("L" level) is input to the second input terminal thereof, and the signal IN'_B ("L" level) is input to the third input terminal thereof. Since the voltage VccA ("H" level) is applied to the NAND circuit NAND2, the NAND circuit NAND2 performs a NAND operation, and transmits a result of the operation ("H" level) to the second output circuit 250 as the signal CTL4.

Details of the voltage of the node N4 and the operations of the NOR circuit NOR3 and the transistor TR5 are the same as those in the case of (1-1) above.

The signal DIR'_B ("H" level) is input to the first input terminal of the NOR circuit NOR4, the signal DIR'_A ("H" level) is input to the second input terminal thereof, and the signal IN'_B ("L" level) is input to the third input terminal thereof. Since the voltage VccA ("H" level) is applied to the NOR circuit NOR4 via the transistor TR5, the NOR circuit NOR4 performs a NOR operation, and transmits a result of the operation ("L" level) to the second output circuit 250 as the signal CTL5.

Details of the voltages of the nodes N5 and N6 and the operations of the transistors TR6 to TR8 are the same as those in the case of (1-1) above. The terminal A is brought to the HZ state, and the second output circuit 250 brings the signal OUT_A to the HZ state.

(1-3) Where the signal DIR is at the "L" level and the signal IN_B is at the "H" level The state of the signal IN_A, the logic levels of the signals DIR'_A, /DIR'_A, DIR'_B, /DIR'_B, IN'_A, and IN'_B, the voltage levels of the nodes N0 to N2 and N4 to N6, and the states of the signals OUT_A and OUT_B in this case are shown in the third row of the truth table in FIG. 22. Since the signal DIR is at the "L" level, the signal IN_B is transmitted from the terminal B to the terminal A.

The inverter circuit INV3 receives the signal DIR ("L" level) from the external device. Since the voltage VccA ("H" level) is applied to the inverter circuits INV3 to INV5, the inverter circuit INV3 transmits an "H"-level signal to the inverter circuit INV4, the inverter circuit INV4 transmits an "L"-level signal to the inverter circuit INV5, the first control circuit 220, and the second control circuit 230 as the signal DIR'_A, and the inverter circuit INV5 transmits an "H"-level signal to the first control circuit 220 and the second control circuit 230 as the signal/DIR'_A.

The inverter circuit INV6 receives the signal DIR ("L" level) from the external device. Since the voltage VccB ("H" level) is applied to the inverter circuits INV6 to INV8, the inverter circuit INV6 transmits an "H"-level signal to the inverter circuit INV7, the inverter circuit INV7 transmits an "L"-level signal to the inverter circuit INV8, the first control circuit 220, and the second control circuit 230 as the signal DIR'_B, and the inverter circuit INV8 transmits an "H"-level signal to the first control circuit 220 and the second control circuit 230 as the signal/DIR'_B.

The inverter circuit INV11 receives the signal IN_B ("H" level) from the external device. Since the voltage VccB ("H" level) is applied to the inverter circuits INV11 and INV12, the inverter circuit INV11 transmits an "L"-level signal to the inverter circuit INV12, and the inverter circuit INV12 transmits an "H"-level signal to the second control circuit 230 as the signal IN'_B.

The signal/DIR'_B ("H" level) is input to the first input terminal of the NAND circuit NAND2, the signal/DIR'_A ("H" level) is input to the second input terminal thereof, and the signal IN'_B ("H" level) is input to the third input terminal thereof. Since the voltage VccA ("H" level) is applied to the NAND circuit NAND2, the NAND circuit NAND2 performs a NAND operation, and transmits a result of the operation ("L" level) to the second output circuit 250 as the signal CTL4.

The signal DIR'_A ("L" level) is input to one input terminal of the NOR circuit NOR3, and the voltage VccB ("H" level) is applied to the other input terminal thereof. Since the voltage VccA ("H" level) is applied to the NOR circuit NOR3, the NOR circuit NOR3 performs a NOR operation, and transmits a result of the operation ("L" level) to the node N4 as the signal CTL3.

Details of the voltage of the node N4 and the operation of the transistor TR5 are the same as those in the case of (1-1) above.

The signal DIR'_B ("L" level) is input to the first input terminal of the NOR circuit NOR4, the signal DIR'_A ("L" level) is input to the second input terminal thereof, and the signal IN'_B ("H" level) is input to the third input terminal thereof. Since the voltage VccA ("H" level) is applied to the NOR circuit NOR4 via the transistor TR5, the NOR circuit NOR4 performs a NOR operation, and transmits a result of the operation ("L" level) to the second output circuit 250 as the signal CTL5.

Details of the operation of the transistor TR6 are the same as those in the case of (1-1) above.

The voltage of the node N5 is brought to the "L" level based on the signal CTL4 ("L" level). Since the voltage ("L" level) of the node N5 is applied to the gate of the transistor TR7 and the voltage VccA ("H" level) is applied to one end of the transistor TR7, the transistor TR7 is turned on. The voltage of the node N6 is brought to the "L" level based on the signal CTL5 ("L" level). Since the voltage ("L" level) of the node N6 is applied to the gate of the transistor TR8, the transistor TR8 is turned off. The transistors TR6 and TR8 are turned off, whereas the transistor TR7 is turned on. As a result, the terminal A is brought to the "H" level, and the second output circuit 250 brings the signal OUT_A to the "H" level.

Since the terminal A is at the "H" level, the inverter circuit INV1 receives an "H"-level signal from the terminal A as the signal IN_A. How the signal is transmitted from the terminal A to the terminal B is the same as that shown in FIG. 9. The signal IN_A is transmitted from the terminal A to the terminal B as shown in FIG. 9, the terminal B is brought to the HZ state, and the signal OUT_B is brought to the HZ state.

(1-4) Where the signal DIR is at the "L" level and the signal IN_B is at the "L" level The state of the signal IN_A, the logic levels of the signals DIR'_A, /DIR'_A, DIR'_B, /DIR'_B, IN'_A, and IN'_B, the voltage levels of the nodes NO to N2 and N4 to N6, and the states of the signals OUT_A and OUT_B in this case are shown in the fourth row of the truth table in FIG. 22.

Details of the operations of the inverter circuits INV3 to INV8 are the same as those in the case of (1-3) above.

The inverter circuit INV11 receives the signal IN_B ("L" level) from the external device. Since the voltage VccB ("H" level) is applied to the inverter circuits INV11 and INV12, the inverter circuit INV11 transmits an "H"-level signal to the inverter circuit INV12, and the inverter circuit INV12 transmits an "L"-level signal to the second control circuit 230 as the signal IN'_B.

The signal/DIR'_B ("H" level) is input to the first input terminal of the NAND circuit NAND2, the signal/DIR'_A ("H" level) is input to the second input terminal thereof, and the signal IN'_B ("L" level) is input to the third input terminal thereof. Since the voltage VccA ("H" level) is applied to the NAND circuit NAND2, the NAND circuit NAND2 performs a NAND operation, and transmits a result of the operation ("H" level) to the second output circuit 250 as the signal CTL4.

Details of the voltage of the node N4 and the operations of the NOR circuit NOR3 and the transistor TR5 are the same as those in the case of (1-3) above.

The signal DIR'_B ("L" level) is input to the first input terminal of the NOR circuit NOR4, the signal DIR'_A ("L" level) is input to the second input terminal thereof, and the signal IN'_B ("L" level) is input to the third input terminal thereof. Since the voltage VccA ("H" level) is applied to the NOR circuit NOR4 via the transistor TR5, the NOR circuit NOR4 performs a NOR operation, and transmits a result of the operation ("H" level) to the second output circuit 250 as the signal CTL5.

Details of the operation of the transistor TR6 are the same as those in the case of (1-3) above.

The voltage of the node N5 is brought to the "H" level based on the signal CTL4 ("H" level). Since the voltage ("H" level) of the node N5 is applied to the gate of the transistor TR7, the transistor TR7 is turned off. The voltage of the node N6 is brought to the "H" level based on the signal CTL5 ("H" level). Since the voltage ("H" level) of the node N6 is applied to the gate of the transistor TR8 and the ground voltage VSS is applied to the other end of the transistor TR8, the transistor TR8 is turned on. The transistors TR6 and TR7 are turned off, whereas the transistor TR8 is turned on. As a result, the terminal A is brought to the "L" level, and the second output circuit 250 brings the signal OUT_A to the "L" level.

Since the terminal A is at the "L" level, the inverter circuit INV1 receives an "L"-level signal from the terminal A as the signal IN_A. How the signal is transmitted from the terminal A to the terminal B is the same as that shown in FIG. 10. The signal IN_A is transmitted from the terminal A to the terminal B as shown in FIG. 10, the terminal B is brought to the HZ state, and the signal OUT_B is brought to the HZ state.

(2) Where the voltage VccA is at the "H" level and the voltage VccB is at the "L" level The case where the voltage VccA is at the "H" level and the voltage VccB is at the "L" level will be described.

(2-1) Where the signal DIR is at the "H" level and the signal IN_A is at the "H" level The state of the signal IN_B, the logic levels of the signals DIR'_A, /DIR'_A, DIR'_B, /DIR'_B, IN'_A, and IN'_B, the voltage levels of the nodes NO to N2 and N4 to N6, and the states of the signals OUT_A and OUT_B in this case are shown in the first row of the truth table in FIG. 23. How the signal is transmitted from the terminal A to the terminal B is the same as that shown in FIG. 12 described in the first embodiment. The signal IN_A is transmitted from the terminal A to the terminal B as shown in FIG. 12, the terminal B is brought to the HZ state, and the signal OUT_B is brought to the HZ state.

The inverter circuit INV6 receives the signal DIR ("H" level) from the external device. Since the voltage VccB ("H" level) is not applied to the inverter circuits INV6 to INV8, the inverter circuit INV6 transmits an "L"-level signal to the inverter circuit INV7, the inverter circuit INV7 transmits an "L"-level signal to the inverter circuit INV8, the first control circuit 220, and the second control circuit 230 as the signal DIR'_B, and the inverter circuit INV8 transmits an "L"-level signal to the first control circuit 220 and the second control circuit 230 as the signal/DIR'_B.

Since the terminal B is in the HZ state, the inverter circuit INV11 receives a signal in the HZ state from the terminal B as the signal IN_B. Since the voltage VccB ("H" level) is not applied to the inverter circuits INV11 and INV12, the inverter circuit INV11 transmits an "L"-level signal to the inverter circuit INV12, and the inverter circuit INV12 transmits an "L"-level signal to the second control circuit 230 as the signal IN'_B.

The signal/DIR'_B ("L" level) is input to the first input terminal of the NAND circuit NAND2, the signal/DIR'_A ("L" level) is input to the second input terminal thereof, and the signal IN'_B ("L" level) is input to the third input terminal thereof. Since the voltage VccA ("H" level) is applied to the NAND circuit NAND2, the NAND circuit NAND2 performs a NAND operation, and transmits a result of the operation ("H" level) to the second output circuit 250 as the signal CTL4.

The signal DIR'_A ("H" level) is input to one input terminal of the NOR circuit NOR3, and the voltage VccB ("L" level) is applied to the other input terminal thereof. Since the voltage VccA ("H" level) is applied to the NOR circuit NOR3, the NOR circuit NOR3 performs a NOR operation, and transmits a result of the operation ("L" level) to the node N4 as the signal CTL3.

Details of the voltage of the node N4 and the operation of the transistor TR5 are the same as those in the case of (1-1) above.

The signal DIR'_B ("L" level) is input to the first input terminal of the NOR circuit NOR4, the signal DIR'_A ("H"

level) is input to the second input terminal thereof, and the signal IN'_B ("L" level) is input to the third input terminal thereof. Since the voltage VccA ("H" level) is applied to the NOR circuit NOR4 via the transistor TR5, the NOR circuit NOR4 performs a NOR operation, and transmits a result of the operation ("L" level) to the second output circuit 250 as the signal CTL5.

Details of the voltages of the nodes N5 and N6 and the operations of the transistors TR6 to TR8 are the same as those in the case of (1-1) above. The terminal A is brought to the HZ state, and the second output circuit 250 brings the signal OUT_A to the HZ state.

(2-2) Where the signal DIR is at the "H" level and the signal IN_A is at the "L" level The state of the signal IN_B, the logic levels of the signals DIR'_A, /DIR'_A, DIR'_B, /DIR'_B, IN'_A, and IN'_B, the voltage levels of the nodes N0 to N2 and N4 to N6, and the states of the signals OUT_A and OUT_B in this case are shown in the second row of the truth table in FIG. 23. How the signal is transmitted from the terminal A to the terminal B is the same as that shown in FIG. 13 described in the first embodiment. The signal IN_A is transmitted from the terminal A to the terminal B as shown in FIG. 13, the terminal B is brought to the HZ state, and the signal OUT_B is brought to the HZ state.

Details of the operations of the inverter circuits INV6 to INV8 are the same as those in the case of (2-1) above.

Since the terminal B is in the HZ state, the inverter circuit INV11 receives a signal in the HZ state from the terminal B as the signal IN_B. Details of the operations of the inverter circuits INV11 and INV12 are the same as those in the case of (2-1) above.

Details of the voltage of the node N4 and the operations of the NAND circuit NAND2, the NOR circuit NOR3, the transistor TR5, and the NOR circuit NOR4 are the same as those in the case of (2-1) above.

Details of the voltages of the nodes N5 and N6 and the operations of the transistors TR6 to TR8 are the same as those in the case of (2-1) above. The terminal A is brought to the HZ state, and the second output circuit 250 brings the signal OUT_A to the HZ state.

(2-3) Where the signal DIR is at the "L" level and the signal IN_B is at the "H" level The state of the signal IN_A, the logic levels of the signals DIR'_A, /DIR'_A, DIR'_B, /DIR'_B, IN'_A, and IN'_B, the voltage levels of the nodes N0 to N2 and N4 to N6, and the states of the signals OUT_A and OUT_B in this case are shown in the third row of the truth table in FIG. 23.

Details of the operations of the inverter circuits INV3 to INV5 are the same as those in the case of (1-3) above.

The inverter circuit INV6 receives the signal DIR ("L" level) from the external device. Since the voltage VccB ("H" level) is not applied to the inverter circuits INV6 to INV8, the inverter circuit INV6 transmits an "L"-level signal to the inverter circuit INV7, the inverter circuit INV7 transmits an "L"-level signal to the inverter circuit INV8, the first control circuit 220, and the second control circuit 230 as the signal DIR'_B, and the inverter circuit INV8 transmits an "L"-level signal to the first control circuit 220 and the second control circuit 230 as the signal /DIR'_B.

The inverter circuit INV11 receives the signal IN_B ("H" level) from the external device. Since the voltage VccB ("H" level) is not applied to the inverter circuits INV11 and INV12, the inverter circuit INV11 transmits an "L"-level signal to the inverter circuit INV12, and the inverter circuit INV12 transmits an "L"-level signal to the second control circuit 230 as the signal IN'_B.

The signal /DIR'_B ("L" level) is input to the first input terminal of the NAND circuit NAND2, the signal /DIR'_A ("H" level) is input to the second input terminal thereof, and the signal IN'_B ("L" level) is input to the third input terminal thereof. Since the voltage VccA ("H" level) is applied to the NAND circuit NAND2, the NAND circuit NAND2 performs a NAND operation, and transmits a result of the operation ("H" level) to the second output circuit 250 as the signal CTL4.

The signal DIR'_A ("L" level) is input to one input terminal of the NOR circuit NOR3, and the voltage VccB ("L" level) is applied to the other input terminal thereof. Since the voltage VccA ("H" level) is applied to the NOR circuit NOR3, the NOR circuit NOR3 performs a NOR operation, and transmits a result of the operation ("H" level) to the node N4 as the signal CTL3.

The voltage of the node N4 is brought to the "H" level based on the signal CTL3 ("H" level). Since the voltage ("H" level) of the node N4 is applied to the gate of the transistor TR5, the transistor TR5 is turned off.

The signal DIR'_B ("L" level) is input to the first input terminal of the NOR circuit NOR4, the signal DIR'_A ("L" level) is input to the second input terminal thereof, and the signal IN'_B ("L" level) is input to the third input terminal thereof. Since the voltage VccA ("H" level) is not applied to the NOR circuit NOR4 via the transistor TR5, the NOR circuit NOR4 transmits an "L"-level signal to the second output circuit 250 as the signal CTL5.

Details of the voltages of the nodes N5 and N6 and the operations of the transistors TR6 to TR8 are the same as those in the case of (2-1) above. The terminal A is brought to the HZ state, and the second output circuit 250 brings the signal OUT_A to the HZ state.

Since the terminal A is in the HZ state, the inverter circuit INV1 receives a signal in the HZ state from the terminal A as the signal IN_A. The signal IN'_A output from the inverter circuit INV2 is brought to the HZ state.

Details of the voltage of the node N0 and the operations of the NAND circuit NAND1, the NOR circuit NOR1, the transistor TR1, and the NOR circuit NOR2 are the same as those in the case of FIG. 14 described in the first embodiment.

Details of the voltages of the nodes N1 and N2 and the operations of the transistors TR2 to TR4 are the same as those in the case of FIG. 14 described in the first embodiment. The terminal B is brought to the HZ state, and the first output circuit 240 brings the signal OUT_B to the HZ state.

(2-4) Where the signal DIR is at the "L" level and the signal IN_B is at the "L" level The state of the signal IN_A, the logic levels of the signals DIR'_A, /DIR'_A, DIR'_B, /DIR'_B, IN'_A, and IN'_B, the voltage levels of the nodes N0 to N2 and N4 to N6, and the states of the signals OUT_A and OUT_B in this case are shown in the fourth row of the truth table in FIG. 23.

Details of the operations of the inverter circuits INV3 to INV8 are the same as those in the case of (2-3) above.

The inverter circuit INV11 receives the signal IN_B ("L" level) from the external device. Since the voltage VccB ("H" level) is not applied to the inverter circuits INV11 and INV12, the inverter circuit INV11 transmits an "L"-level signal to the inverter circuit INV12, and the inverter circuit INV12 transmits an "L"-level signal to the second control circuit 230 as the signal IN'_B.

Details of the voltage of the node N4 and the operations of the NAND circuit NAND2, the NOR circuit NOR3, the transistor TR5, and the NOR circuit NOR4 are the same as those in the case of (2-3) above.

Details of the voltages of the nodes N5 and N6 and the operations of the transistors TR6 to TR8 are the same as those in the case of (2-3) above. The terminal A is brought to the HZ state, and the second output circuit 250 brings the signal OUT_A to the HZ state.

Since the terminal A is in the HZ state, the inverter circuit INV1 receives a signal in the HZ state from the terminal A as the signal IN_A. The signal IN'_A output from the inverter circuit INV2 is brought to the HZ state.

Details of the voltage of the node N0 and the operations of the NAND circuit NAND1, the NOR circuit NOR1, the transistor TR1, and the NOR circuit NOR2 are the same as those in the case of FIG. 15 described in the first embodiment.

Details of the voltages of the nodes N1 and N2 and the operations of the transistors TR2 to TR4 are the same as those in the case of FIG. 15 described in the first embodiment. The terminal B is brought to the HZ state, and the first output circuit 240 brings the signal OUT_B to the HZ state.

(3) Where the voltage VccA is at the "L" level and the voltage VccB is at the "H" level The case where the voltage VccA is at the "L" level and the voltage VccB is at the "H" level will be described.

(3-1) Where the signal DIR is at the "H" level and the signal IN_A is at the "H" level The state of the signal IN_B, the logic levels of the signals DIR'_A, /DIR'_A, DIR'_B, /DIR'_B, IN'_A, and IN'_B, the voltage levels of the nodes N0 to N2 and N4 to N6, and the states of the signals OUT_A and OUT_B in this case are shown in the first row of the truth table in FIG. 24. How the signal is transmitted from the terminal A to the terminal B is the same as that shown in FIG. 17 described in the first embodiment. The signal IN_A is transmitted from the terminal A to the terminal B as shown in FIG. 17, the terminal B is brought to the HZ state, and the signal OUT_B is brought to the HZ state.

Details of the operations of the inverter circuits INV6 to INV8 are the same as those in the case of (1-1) above.

Since the terminal B is in the HZ state, the inverter circuit INV11 receives a signal in the HZ state from the terminal B as the signal IN_B. The signal IN'_B output from the inverter circuit INV12 is brought to the HZ state.

Since the voltage VccA ("H" level) is not applied to the NAND circuit NAND2, the NAND circuit NAND2 transmits an "L"-level signal to the second output circuit 250 as the signal CTL4.

Since the voltage VccA ("H" level) is not applied to the NOR circuit NOR3, the NOR circuit NOR3 transmits an "L"-level signal to the node N4 as the signal CTL3.

The voltage of the node N4 is brought to the "L" level based on the signal CTL3 ("L" level). The voltage ("L" level) of the node N4 is applied to the gate of the transistor TR5, but the voltage VccA applied to one end of the transistor TR1 is at the "L" level; therefore, the transistor TR5 is turned off.

Since the voltage VccA ("H" level) is not applied to the NOR circuit NOR4 via the transistor TR5, the NOR circuit NOR4 transmits an "L"-level signal to the second output circuit 250 as the signal CTL5.

Since the voltage VccA ("L" level) is applied to the gate of the transistor TR6 and the signal CTL4 ("L" level) is input to the node N5 from the NAND circuit NAND2, the transistor TR6 is turned on or off in accordance with the voltage of the terminal A.

For example, when a voltage ("H" level) higher than the ground voltage VSS is not applied to the terminal A from a memory of the external device via a bus, i.e., when the voltage of the terminal A is at the "L" level, the transistor TR6 is turned off. In this case, the voltage of the node N5 is brought to the "L" level. The voltage ("L" level) of the node N5 is applied to the gate of the transistor TR7, but the voltage VccA applied to one end of the transistor TR7 is at the "L" level; therefore, the transistor TR7 is turned off. The voltage of the node N6 is brought to the "L" level based on the signal CTL5 ("L" level). Since the voltage ("L" level) of the node N6 is applied to the gate of the transistor TR8, the transistor TR8 is turned off. The transistors TR6 to TR8 are turned off. As a result, the terminal A is brought to the HZ state, and the second output circuit 250 brings the signal OUT_A to the HZ state.

In contrast, when a voltage ("H" level) higher than the ground voltage VSS is applied to the terminal A from the memory of the external device via the bus, i.e., when the voltage of the terminal A is at the "H" level, the transistor TR6 is turned on. In this case, the voltage of the node N5 is brought from the "L" level to the "H" level (the voltage of the terminal A). Since the voltage ("H" level) of the node N5 is applied to the gate of the transistor TR7, the transistor TR7 is turned off. The voltage of the node N6 is brought to the "L" level based on the signal CTL5 ("L" level). Since the voltage ("L" level) of the node N6 is applied to the gate of the transistor TR8, the transistor TR8 is turned off. The transistor TR6 is turned on, whereas the transistors TR7 and TR8 are turned off. As a result, the terminal A is brought to the HZ state, and the second output circuit 250 brings the signal OUT_A to the HZ state.

Accordingly, the second output circuit 250 always brings the signal OUT_A to the HZ state regardless of the voltage of the terminal A.

(3-2) Where the signal DIR is at the "H" level and the signal IN_A is at the "L" level The state of the signal IN_B, the logic levels of the signals DIR'_A, /DIR'_A, DIR'_B, /DIR'_B, IN'_A, and IN'_B, the voltage levels of the nodes N0 to N2 and N4 to N6, and the states of the signals OUT_A and OUT_B in this case are shown in the second row of the truth table in FIG. 24. How the signal is transmitted from the terminal A to the terminal B is the same as that shown in FIG. 18 described in the first embodiment. The signal IN_A is transmitted from the terminal A to the terminal B as shown in FIG. 18, the terminal B is brought to the HZ state, and the signal OUT_B is brought to the HZ state.

Details of the operations of the inverter circuits INV6 to INV8 are the same as those in the case of (3-1) above.

Since the terminal B is in the HZ state, the inverter circuit INV11 receives a signal in the HZ state from the terminal B as the signal IN_B. The signal IN'_B output from the inverter circuit INV12 is brought to the HZ state.

Details of the voltage of the node N4 and the operations of the NAND circuit NAND2, the NOR circuit NOR3, the transistor TR5, and the NOR circuit NOR4 are the same as those in the case of (3-1) above.

Details of the voltages of the nodes N5 and N6 and the operations of the transistors TR6 to TR8 are the same as those in the case of (3-1) above. The terminal A is brought to the HZ state, and the second output circuit 250 brings the signal OUT_A to the HZ state.

(3-3) Where the signal DIR is at the "L" level and the signal IN_B is at the "H" level The state of the signal IN_A, the logic levels of the signals DIR'_A, /DIR'_A, DIR'_B, /DIR'_B, IN'_A, and IN'_B, the voltage levels of the nodes N0 to N2 and N4 to N6, and the states of the signals OUT_A and OUT_B in this case are shown in the third row of the truth table in FIG. 24.

The inverter circuit INV3 receives the signal DIR ("L" level) from the external device. Since the voltage VccA ("H" level) is not applied to the inverter circuits INV3 to INV5, the inverter circuit INV3 transmits an "L"-level signal to the inverter circuit INV4, the inverter circuit INV4 transmits an "L"-level signal to the inverter circuit INV5, the first control circuit 220, and the second control circuit 230 as the signal DIR'_A, and the inverter circuit INV5 transmits an "L"-level signal to the first control circuit 220 and the second control circuit 230 as the signal /DIR'_A.

Details of the operations of the inverter circuits INV6 to INV8, INV11, and INV12 are the same as those in the case of (1-3) above.

The signal/DIR'_B ("H" level) is input to the first input terminal of the NAND circuit NAND2, the signal/DIR'_A ("L" level) is input to the second input terminal thereof, and the signal IN'_B ("H" level) is input to the third input terminal thereof. Since the voltage VccA ("H" level) is not applied to the NAND circuit NAND2, the NAND circuit NAND2 transmits an "L"-level signal to the second output circuit 250 as the signal CTL4.

Details of the voltage of the node N4 and the operations of the NOR circuit NOR3 and the transistor TR5 are the same as those in the case of (3-1) above.

The signal DIR'_B ("L" level) is input to the first input terminal of the NOR circuit NOR4, the signal DIR'_A ("L" level) is input to the second input terminal thereof, and the signal IN'_B ("H" level) is input to the third input terminal thereof. Since the voltage VccA ("H" level) is not applied to the NOR circuit NOR4 via the transistor TR5, the NOR circuit NOR4 transmits an "L"-level signal to the second output circuit 250 as the signal CTL5.

Details of the voltages of the nodes N5 and N6 and the operations of the transistors TR6 to TR8 are the same as those in the case of (3-1) above. The terminal A is brought to the HZ state, and the second output circuit 250 brings the signal OUT_A to the HZ state.

Since the terminal A is in the HZ state, the inverter circuit INV1 receives a signal in the HZ state from the terminal A as the signal IN_A. Since the voltage VccA ("H" level) is not applied to the inverter circuits INV1 and INV2, the inverter circuit INV1 transmits an "L"-level signal to the inverter circuit INV2, and the inverter circuit INV2 transmits an "L"-level signal to the first control circuit 220 as the signal IN'_A.

Details of the voltage of the node N0 and the operations of the NAND circuit NAND1, the NOR circuit NOR1, the transistor TR1, and the NOR circuit NOR2 are the same as those in the case of FIG. 19 described in the first embodiment.

Details of the voltages of the nodes N1 and N2 and the operations of the transistors TR2 to TR4 are the same as those in the case of FIG. 19 described in the first embodiment. The terminal B is brought to the HZ state, and the first output circuit 240 brings the signal OUT_B to the HZ state.

(3-4) Where the signal DIR is at the "L" level and the signal IN_B is at the "L" level The state of the signal IN_A, the logic levels of the signals DIR'_A, /DIR'_A, DIR'_B, /DIR'_B, IN'_A, and IN'_B, the voltage levels of the nodes N0 to N2 and N4 to N6, and the states of the signals OUT_A and OUT_B in this case are shown in the fourth row of the truth table in FIG. 24.

Details of the operations of the inverter circuits INV3 to INV8 are the same as those in the case of (3-3) above. Details of the operations of the inverter circuits INV11 and INV12 are the same as those in the case of (1-4) above.

The signal/DIR'_B ("H" level) is input to the first input terminal of the NAND circuit NAND2, the signal/DIR'_A ("L" level) is input to the second input terminal thereof, and the signal IN'_B ("L" level) is input to the third input terminal thereof. Since the voltage VccA ("H" level) is not applied to the NAND circuit NAND2, the NAND circuit NAND2 transmits an "L"-level signal to the second output circuit 250 as the signal CTL4.

Details of the voltage of the node N4 and the operations of the NOR circuit NOR3 and the transistor TR5 are the same as those in the case of (3-3) above.

The signal DIR'_B ("L" level) is input to the first input terminal of the NOR circuit NOR4, the signal DIR'_A ("L" level) is input to the second input terminal thereof, and the signal IN'_B ("L" level) is input to the third input terminal thereof. Since the voltage VccA ("H" level) is not applied to the NOR circuit NOR4 via the transistor TR5, the NOR circuit NOR4 transmits an "L"-level signal to the second output circuit 250 as the signal CTL5.

Details of the voltages of the nodes N5 and N6 and the operations of the transistors TR6 to TR8 are the same as those in the case of (3-3) above. The terminal A is brought to the HZ state, and the second output circuit 250 brings the signal OUT_A to the HZ state.

Since the terminal A is in the HZ state, the inverter circuit INV1 receives a signal in the HZ state from the terminal A as the signal IN_A. Since the voltage VccA ("H" level) is not applied to the inverter circuits INV1 and INV2, the inverter circuit INV1 transmits an "L"-level signal to the inverter circuit INV2, and the inverter circuit INV2 transmits an "L"-level signal to the first control circuit 220 as the signal IN'_A.

Details of the voltage of the node N0 and the operations of the NAND circuit NAND1, the NOR circuit NOR1, the transistor TR1, and the NOR circuit NOR2 are the same as those in the case of FIG. 20 described in the first embodiment.

Details of the voltages of the nodes N1 and N2 and the operations of the transistors TR2 to TR4 are the same as those in the case of FIG. 20 described in the first embodiment. The terminal B is brought to the HZ state, and the first output circuit 240 brings the signal OUT_B to the HZ state.

2.3 Advantageous Effects

The IC 1 according to the present embodiment includes the configuration of the IC 1 according to the first embodiment, and thus can control the output signal OUT_B from the terminal B to be in the high impedance state under the condition where at least one of the voltages VccA and VccB is not applied to the IC 1, as in the first embodiment.

The IC 1 according to the present embodiment also includes, in the second control circuit 230, the NOR circuit NOR3 and the transistor TR5 in order to control the voltage of the node N6 when the voltage VccB is not applied. Therefore, when the voltage VccB is not applied and the signal DIR is at the "H" level, the voltage of the node N6 can be brought to the "L" level and the signal OUT_A is brought to the HZ state.

The IC 1 according to the present embodiment also includes, in the second output circuit 250, the transistor TR6 in order to control the voltage of the node N5 when the voltage VccA is not applied. Therefore, when the voltage VccA is not applied, the voltage of the node N5 can be brought to the "H" level and the signal OUT_A is brought to the HZ state.

The configuration according to the present embodiment can also control the output signal OUT_A from the terminal A to be in the high impedance state under the condition where at least one of the voltages VccA and VccB is not applied to the IC 1.

Accordingly, the operation reliability of the IC 1 can be improved in either the case where the input signal is transmitted from the terminal A to the terminal B or the case where the input signal is transmitted from the terminal B to the terminal A.

3. Modifications Etc

As described above, a semiconductor device (1) according to an embodiment includes: a first circuit (100) to which a first voltage (VccA) is applied and which is capable of receiving a first input signal (IN_A) and a second input signal (DIR) and is capable of generating a first signal (IN'_A) based on the first input signal, a second signal (DIR'_A) based on the second input signal, and a third signal (/DIR'_A) obtained by inverting a logic level of the second signal; a second circuit (110) to which a second voltage (VccB) different from the first voltage is applied and which is capable of receiving the second input signal and is capable of generating a fourth signal (DIR'_B) based on the second input signal and a fifth signal (/DIR'_B) obtained by inverting a logic level of the fourth signal; a third circuit (120) to which the second voltage is applied and which is capable of generating a first control signal (CTL1) based on the first signal, the second signal, and the fourth signal, and a second control signal (CTL2) based on the first voltage, the first signal, the third signal, and the fifth signal; and a fourth circuit (130) to which the second voltage is applied and which is capable of outputting an output signal (OUT_B) based on the first control signal and the second control signal. The output signal is brought to a high impedance state when at least one of the first voltage or the second voltage is not applied.

The semiconductor device (1) according to an embodiment may include a first circuit (200), a second circuit (210), a third circuit (220), a fourth circuit (240), a fifth circuit (230), and a sixth circuit (250). The first circuit (200) may have a configuration in which a first voltage (VccA) is applied to the first circuit (200), and the first circuit (200) is capable of receiving a first input signal (IN_A) and a second input signal (DIR) and is capable of generating a first signal (IN'_A) based on the first input signal, a second signal (DIR'_A) based on the second input signal, and a third signal (/DIR'_A) obtained by inverting a logic level of the second signal. The second circuit (210) may have a configuration in which a second voltage (VccB) different from the first voltage is applied to the second circuit (210), and the second circuit (210) is capable of receiving the second input signal and a third input signal (IN_B) and is capable of generating a fourth signal (DIR'_B) based on the second input signal, a fifth signal (/DIR'_B) obtained by inverting a logic level of the fourth signal, and a sixth signal (IN'_B) based on the third input signal. The third circuit (220) may have a configuration in which the second voltage is applied to the third circuit (220), and the third circuit (220) is capable of generating a first control signal (CTL1) based on the first signal, the second signal, and the fourth signal, and a second control signal (CTL2) based on the first voltage, the first signal, the third signal, and the fifth signal. The fourth circuit (240) may have a configuration in which the second voltage is applied to the fourth circuit (240), and the fourth circuit (240) is capable of outputting a first output signal (OUT_B) based on the first control signal and the second control signal. The fifth circuit (230) may have a configuration in which the first voltage is applied to the fifth circuit (230), and the fifth circuit (230) is capable of generating a third control signal (CTL4) based on the third signal, the fifth signal, and the sixth signal, and a fourth control signal (CTL5) based on the second voltage, the second signal, the fourth signal, and the sixth signal. The sixth circuit (250) may have a configuration in which the first voltage is applied to the sixth circuit (250), and the sixth circuit (250) is capable of outputting a second output signal (OUT_A) based on the third control signal and the fourth control signal. The first output signal and the second output signal are brought to a high impedance state when at least one of the first voltage or the second voltage is not applied.

The embodiments are not limited to the above-described ones, and various modifications are possible.

For example, the first input circuit 100 included in the IC 1 according to the first embodiment may have the configuration shown in FIG. 25. FIG. 25 is a circuit diagram showing an example of the configuration of a modification of the first input circuit 100 included in the IC 1 according to the first embodiment.

The first input circuit 100 includes an inverter circuit INV9. The inverter circuit INV9 operates using the voltage VccA as the operating voltage.

The first input circuit 100 receives the signal IN_A from an external device via the terminal A. The first input circuit 100 transmits the received signal to the control circuit 120 as the signal IN'_A.

The first input circuit 100 receives the signal DIR from the external device via the terminal C. The first input circuit 100 transmits the received signal to the control circuit 120 as the signal DIR'_A.

The inverter circuit INV9 receives the signal DIR from the external device via the terminal C. The inverter circuit INV9 transmits a signal obtained by inverting the logic level of the received signal to the control circuit 120 as the signal /DIR'_A.

When the voltage VccA ("H" level) is applied to the IC 1, the signal IN'_A is brought to the same logic level as the signal IN_A, the signal DIR'_A is brought to the same logic level as the signal DIR, and the signal /DIR'_A is brought to a different logic level from the signal DIR. In contrast, when the voltage VccA ("H" level) is not applied to the IC 1, the signals IN'_A, DIR'_A, and /DIR'_A are brought to the "L" level.

The second input circuit 110 included in the IC 1 according to the first embodiment may have the configuration shown in FIG. 26. FIG. 26 is a circuit diagram showing an example of the configuration of a modification of the second input circuit 110 included in the IC 1 according to the first embodiment.

The second input circuit 110 includes an inverter circuit INV10. The inverter circuit INV10 operates using the voltage VccB as the operating voltage.

The second input circuit 110 receives the signal DIR from an external device via the terminal C. The second input circuit 110 transmits the received signal to the control circuit 120 as the signal DIR'_B.

The inverter circuit INV10 receives the signal DIR from the external device via the terminal C. The inverter circuit INV10 transmits a signal obtained by inverting the logic level of the received signal to the control circuit 120 as the signal /DIR'_B.

When the voltage VccB ("H" level) is applied to the IC 1, the signal DIR'_B is brought to the same logic level as the signal DIR, and the signal /DIR'_B is brought to a different logic level from the signal DIR. In contrast, when the voltage VccB ("H" level) is not applied to the IC 1, the signals DIR'_B and/DIR'_B are brought to the "L" level.

The first input circuit 100 is not limited to the circuit described in the first embodiment as long as it operates with the voltage VccA, and it can output the signal IN'_A at the same logic level as the signal IN_A and can output the signal DIR'_A at the same logic level as the signal DIR as well as the signal/DIR'_A obtained by inverting the logic level of the signal DIR'_A.

The second input circuit 110 is not limited to the circuit described in the first embodiment as long as it operates with the voltage VccB, and it can output the signal DIR'_B at the same logic level as the signal DIR as well as the signal/DIR'_B obtained by inverting the logic level of the signal DIR'_B.

The control circuit 120 is not limited to the circuit described in the first embodiment as long as it can bring the voltage of the node N2 to the "L" level when the voltage VccA is not applied and the signal DIR is at the "H" level.

The output circuit 130 is not limited to the circuit described in the first embodiment as long as it can bring the voltage of the node N1 to the "H" level when the voltage VccB is not applied.

The first input circuit 200 included in the IC 1 according to the second embodiment may have the same configuration as that shown in FIG. 25.

The second input circuit 210 included in the IC 1 according to the second embodiment may have the configuration shown in FIG. 27. FIG. 27 is a circuit diagram showing an example of the configuration of a modification of the second input circuit 210 included in the IC 1 according to the second embodiment.

The second input circuit 210 includes an inverter circuit INV13. The inverter circuit INV13 operates using the voltage VccB as the operating voltage.

The second input circuit 210 receives the signal IN_B from an external device via the terminal B. The second input circuit 210 transmits the received signal to the second control circuit 230 as the signal IN'_B.

The second input circuit 210 receives the signal DIR from the external device via the terminal C. The second input circuit 210 transmits the received signal to the first control circuit 220 and the second control circuit 230 as the signal DIR'_B.

The inverter circuit INV13 receives the signal DIR from the external device via the terminal C. The inverter circuit INV13 transmits a signal obtained by inverting the logic level of the received signal to the first control circuit 220 and the second control circuit 230 as the signal/DIR'_B.

When the voltage VccB ("H" level) is applied to the IC 1, the signal IN'_B is brought to the same logic level as the signal IN_B, the signal DIR'_B is brought to the same logic level as the signal DIR, and the signal/DIR'_B is brought to a different logic level from the signal DIR. In contrast, when the voltage VccB ("H" level) is not applied to the IC 1, the signals IN'_B, DIR'_B, and/DIR'_B are brought to the "L" level.

The second input circuit 210 is not limited to the circuit described in the second embodiment as long as it operates with the voltage VccB, and it can output the signal IN'_B at the same logic level as the signal IN_B and can output the signal DIR'_B at the same logic level as the signal DIR as well as the signal/DIR'_B obtained by inverting the logic level of the signal DIR'_B.

The second control circuit 230 is not limited to the circuit described in the second embodiment as long as it can bring the voltage of the node N6 to the "L" level when the voltage VccB is not applied and the signal DIR is at the "H" level.

The second output circuit 250 is not limited to the circuit described in the second embodiment as long as it can bring the voltage of the node N5 to the "H" level when the voltage VccA is not applied.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first circuit to which a first voltage is applied and which is capable of receiving a first input signal and a second input signal and is capable of generating a first signal based on the first input signal, a second signal based on the second input signal, and a third signal obtained by inverting a logic level of the second signal;
   a second circuit to which a second voltage different from the first voltage is applied and which is capable of receiving the second input signal and is capable of generating a fourth signal based on the second input signal and a fifth signal obtained by inverting a logic level of the fourth signal;
   a third circuit to which the second voltage is applied and which is capable of generating a first control signal based on the first signal, the second signal, and the fourth signal, and a second control signal based on the first voltage, the first signal, the third signal, and the fifth signal; and
   a fourth circuit to which the second voltage is applied and which is capable of outputting an output signal based on the first control signal and the second control signal,
   wherein the output signal is brought to a high impedance state when at least one of the first voltage or the second voltage is not applied.

2. The device according to claim 1, wherein
   in a case where the first voltage and the second voltage are both applied,
   when the second input signal is at a first logic level, the output signal is brought to a logic level identical to a logic level of the first input signal, and
   when the second input signal is at a second logic level different from the first logic level, the output signal is brought to the high impedance state.

3. The device according to claim 1, wherein
   the third circuit includes a NAND circuit, a first NOR circuit, a second NOR circuit, and a first transistor,
   the second signal is input to a first input terminal of the NAND circuit,
   the fourth signal is input to a second input terminal of the NAND circuit,
   the first signal is input to a third input terminal of the NAND circuit,
   the first control signal is output from an output terminal of the NAND circuit,
   the fifth signal is input to one input terminal of the first NOR circuit,
   the first voltage is applied to another input terminal of the first NOR circuit, an output terminal of the first NOR circuit is coupled to a gate of the first transistor, the second voltage is applied to one end of the first transistor, the other end of the first transistor is coupled to a supply terminal of the second NOR circuit, the third signal is input to a first input terminal of the second NOR circuit, the fifth signal is input to a second input terminal of the second NOR circuit, the first signal is input to a third input terminal of the second NOR circuit, and the second control signal is output from an output terminal of the second NOR circuit.

4. The device according to claim 1, wherein the fourth circuit includes a second transistor, a third transistor, and a fourth transistor, the second voltage is applied to a gate of the second transistor, one end of the second transistor is coupled to a first node to which the first control signal is input, the other end of the second transistor is coupled to a second node from which the output signal is output, a gate of the third transistor is coupled to the first node, the second voltage is applied to one end of the third transistor, the other end of the third transistor is coupled to the second node, a gate of the fourth transistor is coupled to a third node to which the second control signal is input, one end of the fourth transistor is coupled to the second node, and a ground voltage is applied to the other end of the fourth transistor.

5. The device according to claim 1, wherein the first circuit includes a first inverter circuit to which the first input signal is input, a second inverter circuit coupled to an output terminal of the first inverter circuit, a third inverter circuit to which the second input signal is input, a fourth inverter circuit coupled to an output terminal of the third inverter circuit, and a fifth inverter circuit coupled to an output terminal of the fourth inverter circuit, the first circuit outputs an output signal of the second inverter circuit as the first signal, the first circuit outputs an output signal of the fourth inverter circuit as the second signal, and the first circuit outputs an output signal of the fifth inverter circuit as the third signal.

6. The device according to claim 1, wherein the second circuit includes a sixth inverter circuit to which the second input signal is input, a seventh inverter circuit coupled to an output terminal of the sixth inverter circuit, and an eighth inverter circuit coupled to an output terminal of the seventh inverter circuit, the second circuit outputs an output signal of the seventh inverter circuit as the fourth signal, and the second circuit outputs an output signal of the eighth inverter circuit as the fifth signal.

7. The device according to claim 1, wherein the first circuit includes a ninth inverter circuit to which the second input signal is input, the first circuit outputs the first input signal as the first signal, the first circuit outputs the second input signal as the second signal, and the first circuit outputs an output signal of the ninth inverter circuit as the third signal.

8. The device according to claim 1, wherein the second circuit includes a tenth inverter circuit to which the second input signal is input, the second circuit outputs the second input signal as the fourth signal, and the second circuit outputs an output signal of the tenth inverter circuit as the fifth signal.

9. A semiconductor device comprising:

a first circuit to which a first voltage is applied and which is capable of receiving a first input signal and a second input signal and is capable of generating a first signal based on the first input signal, a second signal based on the second input signal, and a third signal obtained by inverting a logic level of the second signal;

a second circuit to which a second voltage different from the first voltage is applied and which is capable of receiving the second input signal and a third input signal and is capable of generating a fourth signal based on the second input signal, a fifth signal obtained by inverting a logic level of the fourth signal, and a sixth signal based on the third input signal;

a third circuit to which the second voltage is applied and which is capable of generating a first control signal based on the first signal, the second signal, and the fourth signal, and a second control signal based on the first voltage, the first signal, the third signal, and the fifth signal;

a fourth circuit to which the second voltage is applied and which is capable of outputting a first output signal based on the first control signal and the second control signal;

a fifth circuit to which the first voltage is applied and which is capable of generating a third control signal based on the third signal, the fifth signal, and the sixth signal, and a fourth control signal based on the second voltage, the second signal, the fourth signal, and the sixth signal; and a sixth circuit to which the first voltage is applied and which is capable of outputting a second output signal based on the third control signal and the fourth control signal, wherein the first output signal and the second output signal are brought to a high impedance state when at least one of the first voltage or the second voltage is not applied.

10. The device according to claim 9, wherein in a case where the first voltage and the second voltage are both applied, when the second input signal is at a first logic level, the first output signal is brought to a logic level identical to a logic level of the first input signal, and the second output signal is brought to a high impedance state, and when the second input signal is at a second logic level different from the first logic level, the first output signal is brought to the high impedance state, and the second output signal is brought to a logic level identical to a logic level of the third input signal.

11. The device according to claim 9, wherein the third circuit includes a first NAND circuit, a first NOR circuit, a second NOR circuit, and a first transistor, the second signal is input to a first input terminal of the first NAND circuit, the fourth signal is input to a second input terminal of the first NAND circuit, the first signal is input to a third input terminal of the first NAND circuit, the first control signal is output from an output terminal of the first NAND circuit, the fifth signal is input to one input terminal of the first NOR circuit, the first voltage is applied to another input terminal of the first NOR circuit, an output terminal of the first NOR circuit is coupled to a gate of the first transistor, the second voltage is applied to one end of the first transistor, the other end of the first transistor is coupled to a supply terminal of the second NOR circuit, the third signal is input to a first input terminal of the second NOR circuit, the fifth signal is input to a second input terminal of the second NOR circuit, the first signal is input to a third input terminal of the second NOR circuit, and the second control signal is output from an output terminal of the second NOR circuit.

12. The device according to claim 9, wherein
the fifth circuit includes a second NAND circuit, a third NOR circuit, a fourth NOR circuit, and a fifth transistor, the fifth signal is input to a first input terminal of the second NAND circuit, the third signal is input to a second input terminal of the second NAND circuit, the sixth signal is input to a third input terminal of the second NAND circuit, the third control signal is output from an output terminal of the second NAND circuit, the second signal is input to one input terminal of the third NOR circuit, the second voltage is applied to another input terminal of the third NOR circuit, an output terminal of the third NOR circuit is coupled to a gate of the fifth transistor, the first voltage is applied to one end of the fifth transistor, the other end of the fifth transistor is coupled to a supply terminal of the fourth NOR circuit, the fourth signal is input to a first input terminal of the fourth NOR circuit, the second signal is input to a second input terminal of the fourth NOR circuit, the sixth signal is input to a third input terminal of the fourth NOR circuit, and the fourth control signal is output from an output terminal of the fourth NOR circuit.

13. The device according to claim 9, wherein
the fourth circuit includes a second transistor, a third transistor, and a fourth transistor, the second voltage is applied to a gate of the second transistor, one end of the second transistor is coupled to a first node to which the first control signal is input, the other end of the second transistor is coupled to a second node from which the first output signal is output, a gate of the third transistor is coupled to the first node, the second voltage is applied to one end of the third transistor, the other end of the third transistor is coupled to the second node, a gate of the fourth transistor is coupled to a third node to which the second control signal is input, one end of the fourth transistor is coupled to the second node, and a ground voltage is applied to the other end of the fourth transistor.

14. The device according to claim 9, wherein
the sixth circuit includes a sixth transistor, a seventh transistor, and an eighth transistor, the first voltage is applied to a gate of the sixth transistor, one end of the sixth transistor is coupled to a fourth node to which the third control signal is input, the other end of the sixth transistor is coupled to a fifth node from which the second output signal is output, a gate of the seventh transistor is coupled to the fourth node, the first voltage is applied to one end of the seventh transistor, the other end of the seventh transistor is coupled to the fifth node, a gate of the eighth transistor is coupled to a sixth node to which the fourth control signal is input, one end of the eighth transistor is coupled to the fifth node, and a ground voltage is applied to the other end of the eighth transistor.

15. The device according to claim 9, wherein
the first circuit includes a first inverter circuit to which the first input signal is input, a second inverter circuit coupled to an output terminal of the first inverter circuit, a third inverter circuit to which the second input signal is input, a fourth inverter circuit coupled to an output terminal of the third inverter circuit, and a fifth inverter circuit coupled to an output terminal of the fourth inverter circuit, the first circuit outputs an output signal of the second inverter circuit as the first signal, the first circuit outputs an output signal of the fourth inverter circuit as the second signal, and the first circuit outputs an output signal of the fifth inverter circuit as the third signal.

16. The device according to claim 9, wherein
the second circuit includes a sixth inverter circuit to which the second input signal is input, a seventh inverter circuit coupled to an output terminal of the sixth inverter circuit, an eighth inverter circuit coupled to an output terminal of the seventh inverter circuit, a ninth inverter circuit to which the third input signal is input, and a tenth inverter circuit coupled to an output terminal of the ninth inverter circuit, the second circuit outputs an output signal of the seventh inverter circuit as the fourth signal, the second circuit outputs an output signal of the eighth inverter circuit as the fifth signal, and the second circuit outputs an output signal of the tenth inverter circuit as the sixth signal.

17. The device according to claim 9, wherein
the first circuit includes an eleventh inverter circuit to which the second input signal is input, the first circuit outputs the first input signal as the first signal, the first circuit outputs the second input signal as the second signal, and the first circuit outputs an output signal of the eleventh inverter circuit as the third signal.

18. The device according to claim 9, wherein
the second circuit includes a twelfth inverter circuit to which the second input signal is input, the second circuit outputs the third input signal as the sixth signal, the second circuit outputs the second input signal as the fourth signal, and the second circuit outputs an output signal of the twelfth inverter circuit as the fifth signal.

\* \* \* \* \*